United States Patent [19]

Shimazu et al.

[11] Patent Number: 4,464,944
[45] Date of Patent: Aug. 14, 1984

[54] PUSH-BUTTON TYPE TUNING APPARATUS

[75] Inventors: Teruo Shimazu; Toshio Edamoto, both of Atsugi; Azuma Miyazawa, Takaidonishi, all of Japan

[73] Assignee: Mitsumi Electric Co. Ltd., Japan

[21] Appl. No.: 313,278

[22] Filed: Oct. 21, 1981

[30] Foreign Application Priority Data

Oct. 24, 1980 [JP] Japan .................. 55-152744[U]
Dec. 23, 1980 [JP] Japan .................. 55-185181[U]
Jan. 22, 1981 [JP] Japan .................... 56-8323[U]
Apr. 13, 1981 [JP] Japan ................... 56-52794[U]

[51] Int. Cl.³ .................... F16N 35/18; H03J 5/06
[52] U.S. Cl. ........................... 74/10.33; 334/7
[58] Field of Search .................. 74/10.33; 334/7; 116/241, 279; 455/170, 175, 155; 220/62; 29/513

[56] References Cited

U.S. PATENT DOCUMENTS 1,676,298 7/1928 Stieglitz .................. 220/62
2,850,202 9/1958 Schneider et al. .......... 220/62
3,035,566 8/1958 Keeney ................... 220/62
3,634,791 1/1972 Yasuda et al. ........... 74/10.33
3,832,907 9/1974 Yasuda ................... 334/7
3,906,806 9/1975 Harlan ................... 334/7
3,947,786 3/1976 Gordon .................. 334/7
4,079,631 3/1978 Chaki .................. 74/10.33

FOREIGN PATENT DOCUMENTS 1255745 12/1967 Fed. Rep. of Germany .
2446401 10/1975 Fed. Rep. of Germany .
1535930 8/1968 France .

Primary Examiner—Lawrence J. Staab
Assistant Examiner—Michael J. Gonet
Attorney, Agent, or Firm—Andrus, Sceales, Starke & Sawall

[57] ABSTRACT

A push-button type tuning apparatus comprises a frame consisting of a front side plate part, a rear side plate part, right and left side plate parts, and a bottom plate part, a coil case fixedly provided on the frame, a plurality of guiding members at least having one end fixed to the front side plate part of the frame and extending towards the rear side plate part, a slider capable of sliding under the guide of said guiding members provided on the guiding members, a rotatable member axially supported at both side plate parts in a rotatable state, and a plurality of push-button assemblies arranged and provided in the frame. The frame is formed from a single plate member by unitarily bending the front and rear side plate parts and the right and left side plate parts at four sides of the bottom plate part.

13 Claims, 22 Drawing Figures

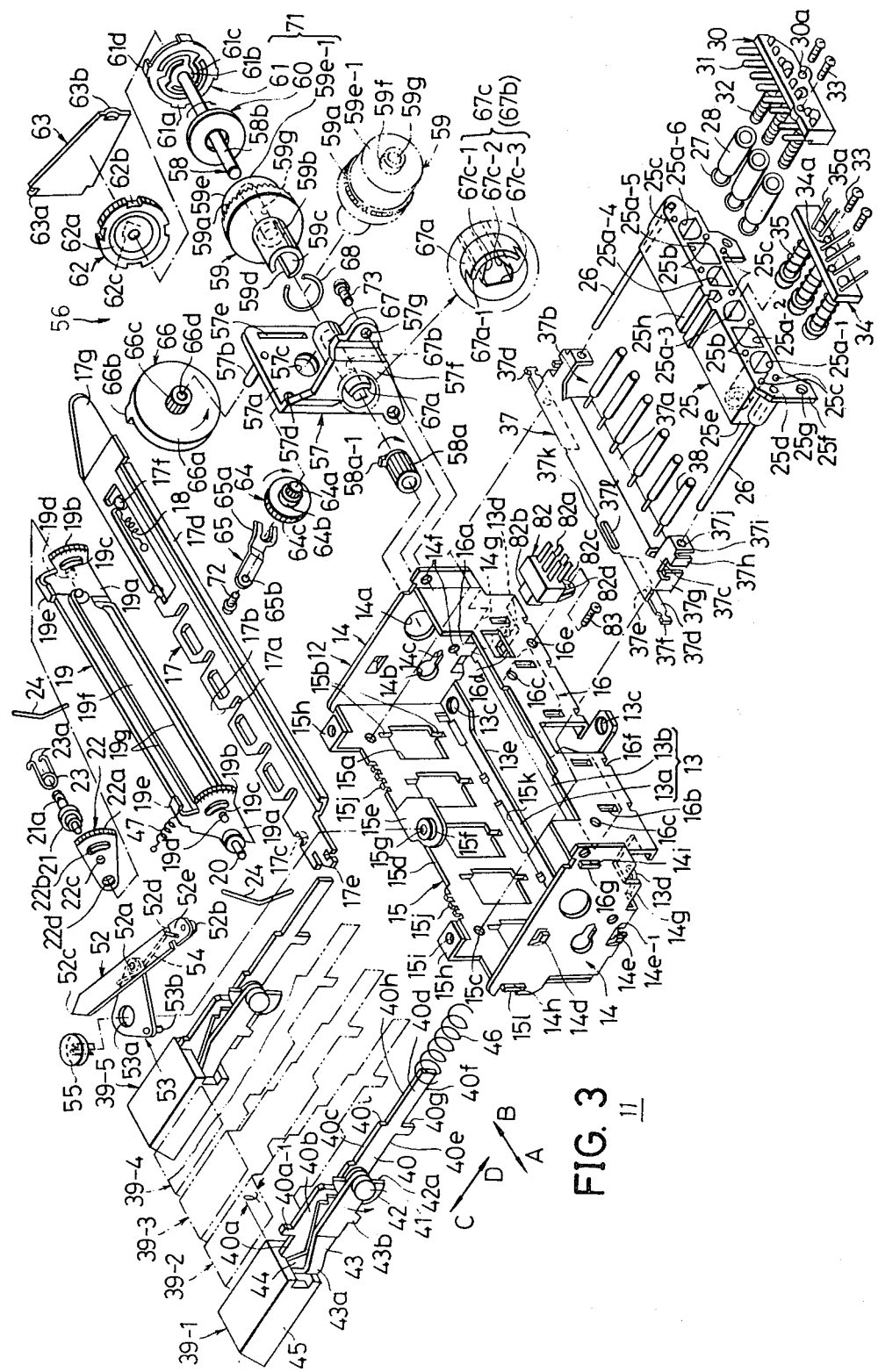

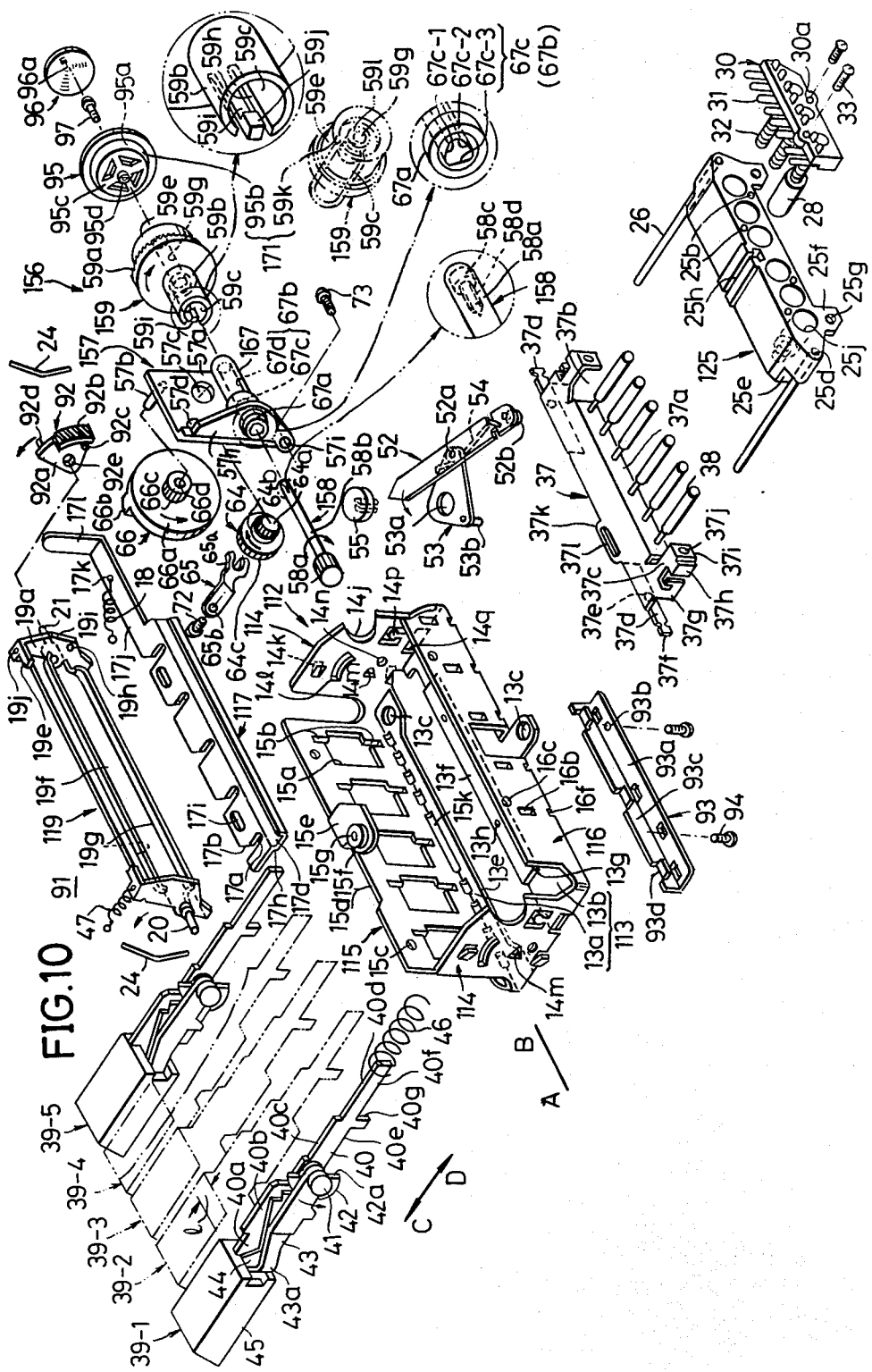

PUSH-BUTTON TYPE TUNING APPARATUS

BACKGROUND OF THE INVENTION

The present invention generally relates to push-button type tuning apparatuses, and more particularly to a push-button type tuning apparatus in which a frame for supporting a push-button assembly and the like is unitarily formed by bending one plate member.

In a conventional push-button type tuning apparatus, a frame consists of two members, that is, the frame is formed from a frame main body and a front side plate. The frame main body is formed by unitarily bending and forming right and left side plate parts and a rear side plate part from a bottom plate part. A rotatable member, sliders provided with cores, and push-button assemblies not provided with push-buttons are successively assembled onto the above plate parts. Then, a separate front side plate is assembled onto the above plate parts so that the push-button assemblies are inserted through holes of the separate front side plate and project outwards from the separate front side plate. The push-buttons are mounted onto the push-button assemblies after the above separate front side plate is assembled. The reason why the separate front side plate is assembled afterwards is because when the front side plate is unitarily formed on the bottom plate part in advance, memory pieces of the push-button assemblies and a lock plate make contact with edges of the holes in the front side plate, and it becomes impossible to assemble and mount the above parts.

In the above conventional example of the push-button type tuning apparatus, the frame consists of two members, mainly, the frame main body and the front side plate. Accordingly, the number of parts which are required becomes large, and the size of the apparatus becomes large due to the complexity of the mechanism. Moreover, play is introduced during the operation of the push-button assembly, and the accuracy of the apparatus is degraded. Furthermore, there was a disadvantage in that the number of stages requires for assembling the apparatus is large due to the large number of parts used in the apparatus.

SUMMARY OF THE INVENTION

Accordingly, it is a general object of the present invention to provide a novel and useful push-button type tuning apparatus in which the above described disadvantages have been overcome.

Another and more specific object of the present invention is to provide a push-button type tuning apparatus in which a frame is unitarily formed by bending one plate member, including a bottom plate part, front and rear plate parts, and right and left plate parts. According to the apparatus of the present invention, the number of parts required for the frame is reduced, and the construction of the apparatus can be simplified to enable reduction of size of the apparatus. Furthermore, the number of stages required upon assembling of the apparatus can be reduced, and the tuning accuracy of the apparatus can be improved.

Still another object of the present invention is to provide a push-button type tuning apparatus in which a projecting part is provided on one and a hole or a cutout is provided on the other of mutually adjacent side plate parts of the four side parts in the above frame, and the projecting parts and holes or cutouts respectively engage with each other, and the above side plate parts are respectively fixed to the adjacent side plates by deforming the projecting parts or the holes or cutouts. According to the apparatus of the present invention, four side plate parts can be formed unitarily on the bottom plate part by bending the single plate member, and the number of parts required for the apparatus accordingly is reduced.

Another object of the present invention is to provide a push-button type tuning apparatus in which a support plate part for supporting a pointer is bent and formed unitarily from the above front side plate part. According to the apparatus of the present invention, the above support plate part for supporting the pointer can further be provided unitarily on the frame, enabling reduction of the number of parts required. Moreover, the tuning accuracy of the apparatus can be improved.

Other objects and further features of the present invention will be apparent from the following detailed description when read in conjunction with the accompanying drawings.

BRIEF DESCRIPTION OF THE DRAWINGS

FIGS. 2 and 3 respectively are a perspective view and a disassembled perspective view showing the whole push-button type tuning apparatus shown in FIG. 1;

FIGS. 9 and 10 respectively are a perspective view and a disassembled perspective view showing another embodiment of a push-button type tuning apparatus according to the present invention.

DETAILED DESCRIPTION

First, description will be given with respect to the construction of an embodiment of a push-button type tuning apparatus according to the present invention, by referring to FIGS. 1 through 3.

Figure 1A:
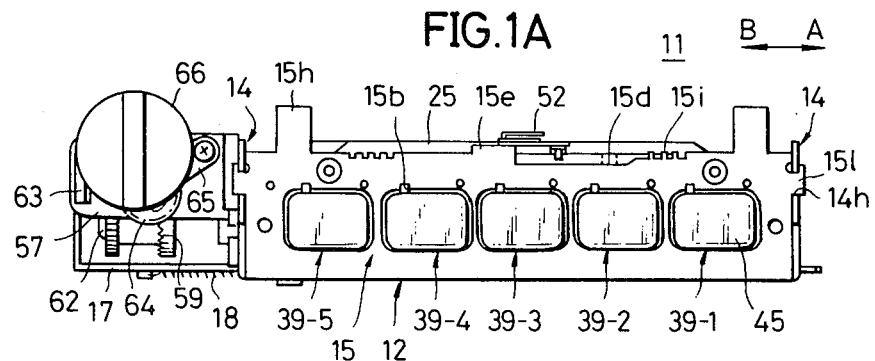
FIGS. 1A, 1B, and 1C respectively are a front view, a plan view, and a side view, showing an embodiment of a push-button type tuning apparatus according to the present invention.
Figure 1B:
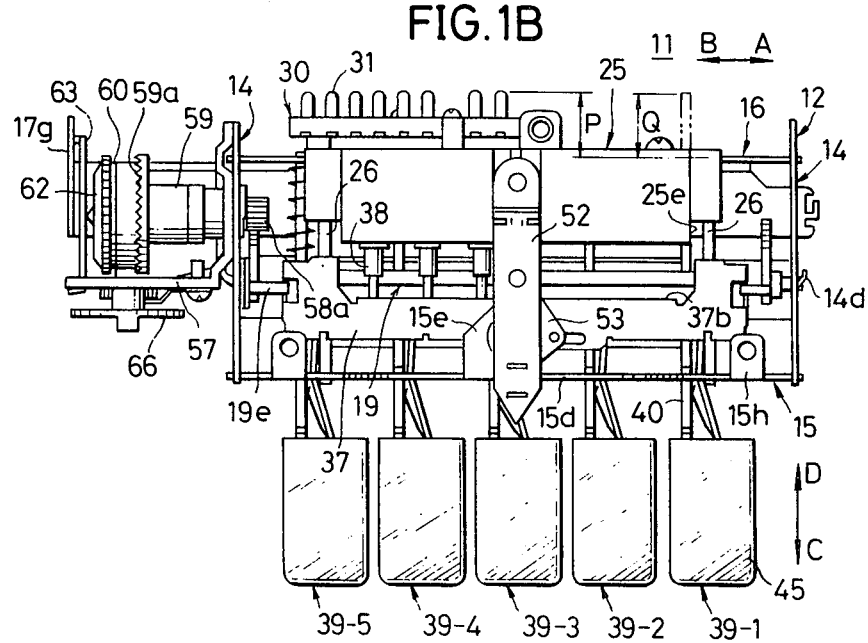
Figure 1C:
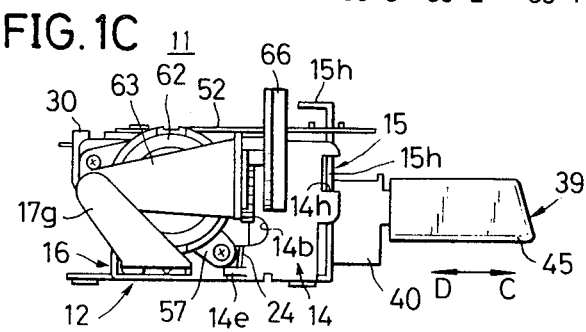
Figure 2:
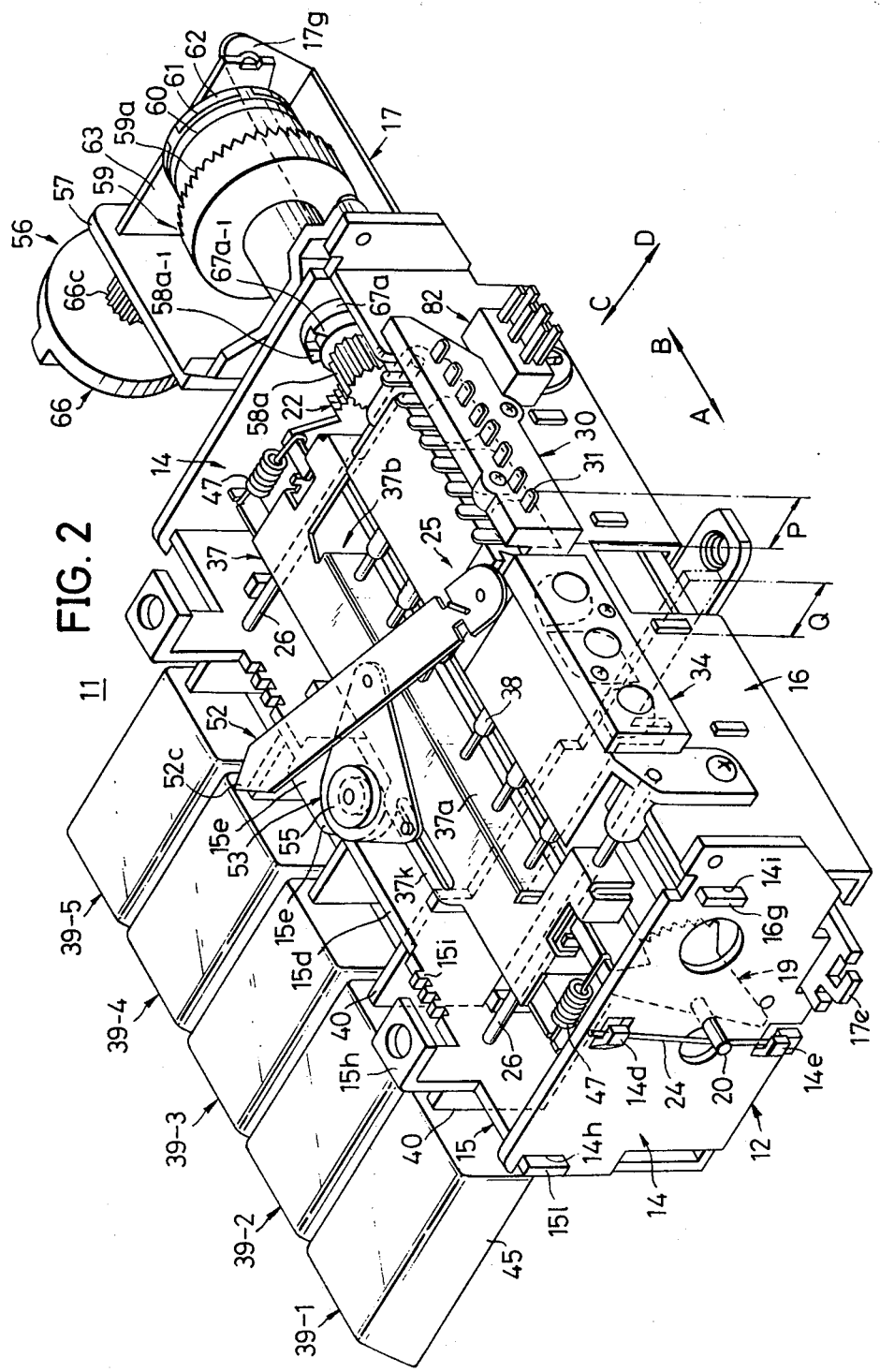

In FIGS. 1 through 3, a push-button type tuning apparatus 11 comprises a frame 12. The above frame 12 is bent and formed from a single metal plate, and consists of a pair of right and left side plate parts 14, a front side plate part 15, and a rear side plate part 16 having a relatively low height. The above right and left side plate parts 14, the front side plate part 15, and the rear side plate part 16 are unitarily formed by bending these plate parts towards an upward direction in FIGS. 1 through 3, from a bottom plate part 13 consisting of portions 13a and 13b. The bottom plate portion 13a has a pair of mounting holes 13c (only one shown in FIG. 3), while the bottom plate portion 13b has a pair of mounting holes 13c and a pair of projecting portions 13d. Moreover, an opening 13e extending in the right and left directions, is provided between the bottom plate portions 13a and 13b. This opening 13e permits a lower end of a rotatable member 19 which will be described hereinafter, to enter into the opening 13e within a range of the width of the bottom plate part 13, upon partial rotation of the rotatable member 19. Hence, the height of the tuning apparatus can accordingly be reduced.

Figure 7A:
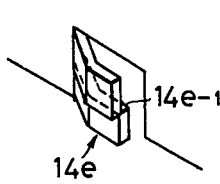
FIGS. 7A, 7B, 7C, and 7D are perspective views respectively showing various modifications of parts for holding a wire spring which urges a rotary frame of the frame in the push-button type tuning apparatus shown in FIG. 1.

The right and left side plate parts 14 are of symmetrical shapes, and respectively have a hole 14a for mounting a support plate 57 of a manual tuning and clutch unit 56 which will be described hereinafter, a bearing hole 14b provided with a triangular tip hole 14c, upper and lower cut-and-raised portions 14d and 14e, a pair of screw holes 14f, and a lower cutout hole 14g. The above right and left side plate parts 14 respectively are further provided with a cutout depression 14h at the front end, and a hole 14i in the vicinity of the rear end thereof. As shown in FIG. 7A, each cut-and-raised portion 14e of the right and left side plate portions 14 is provided with a step portion 14e-1 at the central part of the inner surface side thereof, extending from the frontward to the rearward direction. Hence, the upper half of the above cut-and-raised portion 14 further separated from the outer side surface of the side plate part 14 than the lower half of the cut-and-raised portion 14e.

The front side plate part 15 has, for example, five rectangular support holes 15a respectively having upper and lower cutout holes 15b, a pair of holes 15c, a pointer support plate portion 15e bent and formed from a depression 15d provided at the central part on the upper end of the front side plate part 15, a pair of mounting plate portions 15h having a hole 15i, and a pair of portions 15j respectively consisting of projections and depressions for positioning the pointer provided on both sides of the upper end of the front side plate part 15. The above pointer support plate portion 15e is provided with a cylindrical projection 15f having a hole 15g therein. A plurality of longitudinal holes 15k are provided at the lower part of the above front side plate part 15, in order to facilitate the bending operation in which the front side plate part 15 is bent and formed from the bottom plate portion 13a. Moreover, projecting portions 15l are provided on both sides of the front side plate part 15.

Accordingly, when the front side plate part 15 is bent, the projecting portions 15l on both sides of the front side plate part 15 are respectively fitted into the cutout depressions 14h provided on the right and left side plate parts 14, to position the front side plate part 15. The above front side plate part 15 and the right and left side plate parts 14 are then rigidly fixed, by pressing and deforming the upper edges of the cutout depressions 14h. The above pointer support plate portion 15e can be bent and formed, by holding the upper end of a plate-shaped tool (not shown) which is inserted through the longitudinal holes 15k from the lower part of the frame 12 at a position at the upper part of the frame, and then bending the pointer support portion 15e until the pointer support portion 15e makes contact with the plate-shaped tool. Therefore, the pointer support plate part 15e extends in the direction of the rear side plate part 16, in parallel with the bottom plate part 13. Moreover, due to the effect of the above depression 15d, the upper surface of the pointer support plate part 15e becomes of a level substantially equal to the level of the upper end of the right and left side plate parts 14. Thus, the height of the frame 12 can be reduced. In addition, the depression 15d in the front side plate part 15 permits a frontwardly projecting plate portion 37k of a slider 37 provided with a core which will be described hereinafter, to enter therein, without hitting against the front side plate part 15. Hence, the depth, that is, the size of the frame 12 along a direction from the front part to the rear part can be reduced, eliminating the need to provide a space so that the above front projecting plate portion 37k does not hit against the front side plate part 15.

The rear side plate part 16 has a wide depression 16a at the central part of the upper end thereof, five support holes 16b, a pair of screw holes 16c, a rectangular hole 16d for mounting a switch, and a screw hole 16e. A plurality of holes 16f which function similarly as the longitudinal holes 15k of the above front side plate part 15, to facilitate bending of the rear side plate part 16, are respectively provided at the lower part of the rear side plate part 16. Furthermore, projecting portions 16g are provided on both sides of the rear side plate part 16. Accordingly, when the rear side plate part 16 is bent, the projecting portions 16g on both sides of the rear side plate part 16 are respectively fitted into the holes 14i of the right and left side plate parts 14, to position the rear side plate part 16. The rear side plate 16 is then rigidly fixed by pressing and deforming the upper edges of the holes 14i.

Instead of bending the right and left side plate parts 14 first before bending the front and rear side plate parts 15 and 16, the same result can be obtained by bending the front and rear side plate parts 15 and 16 first, before bending the right and left side plate parts 14. Moreover, the projecting portions 15l and 16g can be deformed in order to rigidly fix the above plate parts 14, 15, and 16. Furthermore, projecting portions may be formed on the right and left side plate parts 14, so that these projecting portions can be fitted into cutout depressions or holes of the front and rear side plate parts 15 and 16. In this case, by similarly pressing and deforming the upper edges of the holes or depressions or by deforming the projecting parts as in the above described case, the above plate parts 14, 15, and 16 can be rigidly fixed together.

According to the above frame 12, the number of parts required is small since each of the plate parts 14 through 16 are bent and formed from a single metal plate, and the construction can accordingly be simplified. In addition, the fixing operation to fix the plate parts 14 through 16 together is simplified, since the plate parts 14 through 16 can be fixed by inserting the projecting portions into the cutout depressions and the holes and rigidly fixed by pressing and deforming either the projecting portions or the counterparts. A firm construction is thus obtained in which the plate parts 14 through 16 respectively support each other and do not deform even when an external force is applied thereto, and the size of the apparatus can be accurately set. Moreover, the tuning accuracy of the apparatus is improved due to the above described reasons.

A clutch lever 17 has five cam grooves 17a respectively provided with a sloping cam portion 17b, a pair of lower cut-and-raised portions 17c, a lower projection 17d, a left end L-shaped projecting portion 17e, and a projecting portion 17f provided within a hole on the right end thereof. The above clutch lever 17 is further provided with a pressing plate portion 17g at the right end thereof. This clutch lever 17 is mounted after the manual tuning and clutch unit 56 is assembled. When mounting the clutch lever 17, the clutch lever 17 is successively inserted from the left end part of the frame 12, that is, right side in FIG. 3, through the cutout holes 14g of the right and left side plate part 14. Accordingly, the lower cut-and-raised portions 17c and the lower projection 17d respectively make contact with the upper surface of the bottom plate portion 13b, and the clutch lever 17 becomes freely slidable in directions of arrows A and B in a smooth manner.

The clutch lever 17 is constantly urged in the direction of the arrow A by a coil spring which is stretched and provided between the projecting portion 17f and the projecting portion 13d. As will be described hereinafter, the clutch lever 17 is stopped at a position where the pressing plate portion 17g makes contact with a rotatable plate 63 and lock a clutch mechanism 71. The L-shaped projecting portion 17e is bent slightly downwards to make contact with the bottom plate portion 13b when the clutch lever 17 slides in the direction of the arrow B, in order to prevent excessive sliding of the clutch lever 17.

The rotatable member 19 is provided with a support plate portion 19a on both ends thereof, by bending a single long and narrow metal plate. Each support plate portion 19a comprises a fan-shaped gear portion 19b, a longitudinal hole 19c, a projecting portion 19d, and a bent projecting portion 19e at the upper end thereof. Moreover, edges in the longitudinal direction provided at the upper and lower end of an opening 19f of the rotatable member 19, are respectively bent in a manner such that contact members 19g are formed. The cross sections of the contact members 19g are substantially of an L-shape along the longitudinal direction thereof. A pin 20 and a pin 21 having an outer peripheral groove portion 21a, are respectively embeddedly provided in each support plate portion 19a.

A fan-shaped gear 22 consists of a fan-shaped gear portion 22a, a longitudinal hole 22b, a hole 22c, and a bearing hole 22d. The above pin 21 is inserted into the bearing hole 22d of the fan-shaped gear 22. The fan-shaped gear portion 22a is placed over the fan-shaped gear portion 19b at the support plate portion 19a, in a state where there is a slight phase difference between the longitudinal holes 22b and 19c. Moreover, the hole 22c and the projecting portion 19d are assembled so that the slight movement is possible between the hole 22c and the projecting portion 19d.

Both ends 23a of a torsion spring 23 which is fitted over the pin 21, are respectively inserted and held at both ends of the longitudinal holes 22b and 19c. Accordingly, the fan-shaped gear 22 is urged towards the counterclockwise direction in FIG. 3 with respect to the support plate portion 19a. The fan-shaped gear 22 is thus held at a position where an edge of the hole 22c is rotationally displaced by a small quantity and makes contact with the projecting portion 19d. The above rotational displacement of small quantity is less than the phase difference between the longitudinal holes 22b and 19c. Hence, the fan-shaped gear portions 22a and 19b become slightly shifted in phase with respect to each other along the width of the teeth in the gear. Therefore, when a pinion 58a of a pinion shaft 58 which will be described hereinafter meshes with the above fan-shaped gear portions 22a and 19b of the double gear type, each teeth of the fan-shaped gear portions 22a and 19b are pressed against and positively meshed with the teeth of the pinion 58a. Thus, the backlash between the gear portions and the pinion at this part is completely eliminated, and the tuning accuracy of the apparatus is improved. Since the above rotatable member 19 is constructed so that the support plate portions 19a, contact members 19g, and the fan-shaped gear portions 19b are pressed and unitarily formed from a single metal sheet, the number of parts required and the number of manufacturing stages can be reduced.

The pins 20 and 21 of the above rotatable member 19 are respectively inserted into the triangular tip holes 14c of the bearing holes 14b in the side plate parts 14 of the frame 12. Moreover, due to the action of a wire spring 24 provided between the upper and lower cut-and-raised portions 14d and 14e at both the right and left side plate parts 14, the rotatable member 19 is urged in the direction of an arrow D in FIG. 3 to make contact with two sides of the triangular tip holes 14c. Hence, the rotatable member 19 is positively supported to pivot freely, without play. Since one wire spring 24 engages with the outer peripheral groove portion 21a of the pin 21, the rotatable member 19 is also eliminated of play in the axial direction.

Figure 7B:
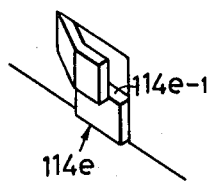
Figure 7C:
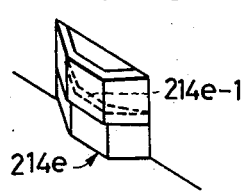
Figure 7D:
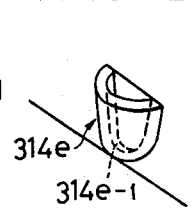

The lower end of the wire spring 24 is inserted into the inner surface side of the lower cut-and-raised portion 14e, and makes contact with the step portion 14e-1 shown in FIG. 7A. Hence, the lower end of the wire spring 24 is accommodated within the cut-and-raised portion 14e, and is not exposed. Accordingly, accidents are prevented in which the manufacturing process is interrupted when the wire spring 24 is caught by a belt or the finger of an operator, in a case where the lower end of the wire spring 24 projects below the frame 12. A similar step portion may be provided in the upper cut-and-raised portion 14d, in order to prevent the wire spring 24 from projecting above the frame 12. The configuration of the cut-and-raised portion 14e is not limited to that described above, and can be of any configuration as long as the lower end of the wire spring 24 is held in position and prevented from projecting by a step portion. That is, a holding portion 114e shown in FIG. 7B may be used instead of the above cut-and-raised portion 14e. The holding portion 114e has a step portion 114e-1, formed by connecting only the lower half of the holding portion 114e at both sides thereof to the side plate part 14. Another modification of the cut-and-raised portion 14e is shown in FIG. 7C wherein upper and lower halves of a holding portion 314e are connected to the side plate part 14 on both sides thereof, comprising a step portion 214e-1 therebetween. Moreover, a step portion 314e-1 can be provided at the lower end of a holding portion 314e having a pouch shape, as shown in FIG. 7D.

Figure 4A:
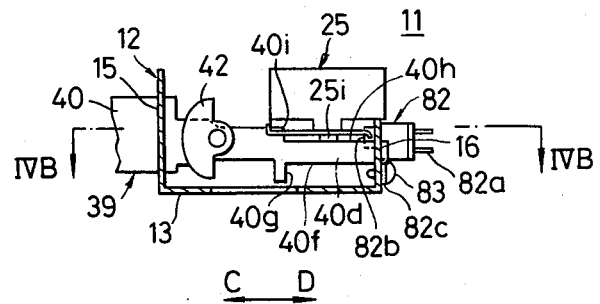
FIGS. 4A and 4B respectively are diagrams showing a vertical cross section of an essential part of the push-button type tuning apparatus shown in FIG. 1, and a horizontal cross section along a line IVB—IVB in FIG. 4A.
Figure 4B:
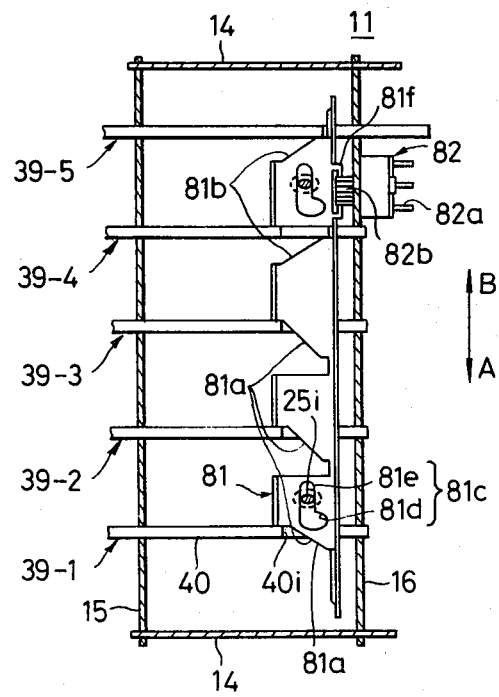

A coil case 25 is made of zinc formed by die-cast, into the shape of a rectangular parallelopiped. The coil case 25 has six holes 25a having irregular cross-sectional shapes (25a-1, 25a-2, 25a-3, . . . , 25a-6), two pairs of screw holes 25b provided at the rear surface thereof, five knock pin contact portions 25c used upon forming of the coil case 25, a pair of holes 25d provided on both sides thereof, a pair of depressions 25e provided on both sides at the front surface thereof, a pair of projecting plate portions 25f provided on the rear surface at the lower portion thereof respectively having a hole 25g, a groove 25h provided on the upper surface thereof, and a pair of engaging projections 25i shown in FIGS. 4A and 4B provided on the lower surface at both sides thereof. Guide poles 26 are respectively fitted into and fixed to the pair of holes 25d provided on both sides of the coil case 25. Three holes 25a-4, 25a-5, and 25a-6 provided with a step for AM stations, which are provided on the right side in FIG. 3, are respectively inserted with a ring 27 and a core sleeve 28.

A terminal plate 30 for AM station has a hole 30a. A plurality of terminals 31 and three coils 32 for AM stations, are embeddedly provided in the terminal plate 30. Each coil 32 is inserted into the corresponding core sleeves 28 inside the holes 25a-4, 25a-5, and 25a-6 provided with a step, with respect to the rear surface of the coil case 25. Moreover, a screw 33 is screwed through the hole 30a into the screw hole 25b, to fix the terminal plate 30. A terminal plate 34 for FM stations is embeddedly provided with three coils 35 for FM stations. Coil leads 35a are provided from the rear surface of the above terminal plate 34. Furthermore, each coil 35 is directly inserted into corresponding holes 25a-1, 25a-2, and 25a-3 provided with a step, at the left side in FIG. 3. The terminal plate 34 is fixed by screwing a screw 33 through a hole 34a into the screw hole 25b.

Figure 8A:
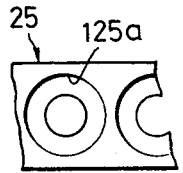
FIGS. 8A, 8B, 8C, 8D, and 8E are diagrams respectively showing a back surface part of various modifications of holes for accommodating a coil spring of a coil case within the push-button type tuning apparatus shown in FIG. 1.
Figure 8B:
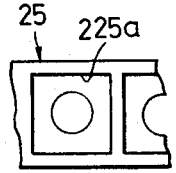
Figure 8C:
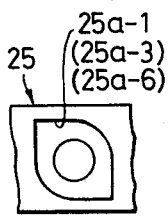
Figure 8D:
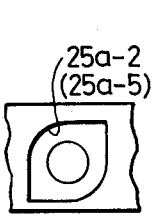
Figure 8E:
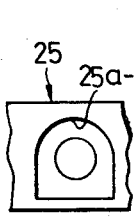

Description will now be given with respect to the above coil case 25 and the holes 25a-1 through 25a-6 respectively provided with a step, by referring to FIGS. 8A through 8E. The coil case 25 is made of zinc, and the quality factor (Q-factor) upon FM tuning is inferior to that obtained when the coil case is made of aluminum. However, zinc is used for the coil case 25 since the production cost can be reduced substantially. In order to recover for the decrease in the Q-factor upon FM tuning, the following measures are taken. That is, it is first focused that the Q-factor improves when no coil case is provided since the signal frequency is high upon FM tuning, and on the other hand, separation walls are required to obtain a magnetic seal between adjacent coils. Then it can be easily seen that the cross-sectional shapes of the holes 25a-1, 25a-2, and 25a-3 provided with a step must independently be large as possible within an allowable range of the coil case 25. In order to do this, it can be understood that the hole inserted with the coil 35 can be a hole 125a having a circular cross section as shown in FIG. 8A or a hole 225a having a rectangular cross section as shown in FIG. 8B. However, in reality, space must be provided for the above screw holes 25b and knock pin contact portions 25c. Hence, the holes provided with a step must be shaped so that the above holes and contact portions can be provided. Therefore, the cross-sectional shape of the holes 25a-1, 25a-3, and 25a-6 become as shown in FIG. 8C, the cross-sectional shape of the holes 25a-2 and 25a-5 become as shown in FIG. 8D, and the cross-sectional shape of the hole 25a-4 becomes as shown in FIG. 8E. The reason that the holes 25a-4, 25a-5, and 25a-6 for AM coils are also of irregular cross-sectional shapes suited for FM coils, is because the holes 25a-4 through 25a-6 are used for FM coils in some cases. Moreover, since the signal frequency is low in the case of AM tuning, the value of the Q-factor does not vary particularly when the core sleeves 28 and the AM coils 32 are inserted into the holes 25a-4 through 25a-6 having irregular cross-sectional shapes, as compared to the case where the holes have a circular cross-sectional shape.

The effect introduced with respect to the Q-factor by the coil case, is as indicated in the following example showing some experimental results. In a case where no outer coil case is provided with respect to the FM coil 35, the Q-factor is 170 to 180. When the hole 225a having a rectangular cross section shown in FIG. 8B is used, the Q-factor becomes 130. Moreover, in a case where the holes 25a-1 through 25a-6 have an irregular cross-sectional shape shown in FIGS. 8C through 8E, the Q-factor becomes 120. On the other hand, when the hole 125a having a circular cross section shown in FIG. 8A is used, the Q-factor becomes 110. Accordingly, the Q-factor can be improved by approximately 10 by used of the holes 25a-1 through 25a-6 having the shape described above instead of using the hole 125a having a circular cross section.

The above coil case 25 unitarily holding the terminal plates for both AM and FM radio stations, is placed onto the wide depression 16a of the rear side plate part 16, so that the lower surface of the coil case 25 makes contact with the upper surface of the wide depression 16a with respect to the frame 12. In this state, the projecting plate portions 25f make contact with the rear surface of the rear side plate part 16. Furthermore, each guide pole 26 is inserted through the hole 15c of the front side plate part 15 and accordingly positioned. Screws 36 are screwed through corresponding holes 25g, into the screw holes 16b, to fix the coil case 25 to the frame 12.

The core holding slider 37 has a downwardly bending plate portion 37a for holding six cores 38. The downwardly bending plate portion 37a is formed from a single metal plate, by cutting out the rear part at the center of the plate, and bending this cutout portion. Moreover, a pair of projecting plate portions 37c are relatively formed on both sides of cutout depressions 37b. Each projecting plate portions 37c is provided with downwardly bending portions 37d, 37i and 37g at the front part, outer sides, and the rear part, where the downwardly bending portion 37d has a hole 37e and a projecting portion 37f, the downwardly bending portion 37i has a hole 37j, and the downwardly bending portion 37g has an engaging depression 37h. Each projecting plate portion 37c is further provided with a longitudinal hole 37l formed within the frontwardly projecting plate portion 37k. The above described guide poles 26 are fitted into corresponding pairs of holes 37e and 37j of the slider 37. Moreover, the pair of engaging depressions 37h respectively engage with the upper end bent projecting portions 19e of the rotatable member 19. Therefore, the core holding slider 37 is mounted in a state freely slidable in the direction of the arrows C and D. A coil spring 47 is stretched and provided between the projecting portion 37f of the slider 37 and the projecting portion 19e of the rotatable member 19, in order to eliminate play between the linked rotatable member 19 and the slider 37. In addition, each core 38 is free to enter and leave from corresponding holes 25a-1 through 25a-6 provided with a step, of the coil case 25.

As shown in FIGS. 4A and 4B, a band changeover plate 81 has three cam depressions 81a for AM band provided at the front end with equal pitch, and two cam depressions 81b for FM band provided in a similar manner. A pair of engaging holes 81c consisting of a hole portion 81d and a groove portion 81e, and a rear end holder portion 81f are further provided in the band changeover plate 81. The above band changeover plate 81 is mounted so that the holes 81d of the engaging holes 81c respectively fit over the engaging projections 25i first, and then, the band changeover plate 81 is moved towards the direction of the arrow A in DIF.4B with respect to the lower side of the coil case 25. Thus, the engaging projections 25i fit into the groove portions 81e of the band changeover plate 81. Accordingly, the above band changeover plate 81 becomes supported in a freely slidable state towards the directions of the arrows A and B. Cam projecting portions 40i of push-button assemblies 39-1 through 39-5 which will be described hereinafter, slightly enter into the cam depressions 81a and 81b. Hence, the band changeover plate 81 is prevented from sliding excessively towards the direction of the arrow B, and the engaging projections 25i do not disengage from the hole portions 81d of the engaging holes 81c.

As shown in FIGS. 3, 4A, and 4B, a band changeover switch 82 has terminals 82a, a sliding type changeover manipulation knob 82b, and a mounting plate 82c having a hole 82d. The band changeover switch 82 is provided at a position at the rear surface of the rear side plate part 16 corresponding to the rectangular hole 16d. The band changeover switch 82 is fixed at the above position by screwing a screw 83 through the hole 82d into the screw hole 16e. As shown in FIG. 4B, the knob 82b projecting towards the inner side of the frame 12 engages with the holder portion 81f of the band changeover plate 81. Accordingly, the knob 82b can freely slide unitarily with the band changeover plate 81 towards the directions of the arrows A and B.

By use of the above described construction, the switch 82 is mounted directly to the rear side plate part 16 of the frame 12. Compared to the conventional construction in which the band changeover plate provided at the rear end of the rear side plate of the frame is linked to a band changeover switch mounted to the rear side plate part through a switch holder, the switch holder can be eliminated according to the above described construction. Therefore, the number of parts required can be reduced, to simplify both the construction and the assembling operation. Furthermore, the size of the tuning apparatus from the front part to the rear part thereof, that is, the depth of the apparatus can be reduced significantly, since the band changeover plate 81 is provided within the frame 12, and the switch 82 is mounted directly to the rear side plate part 16.

Five groups of push-button assemblies 39 (39-1 through 39-5) are respectively provided with a memory piece 42 supported by a pin 41 on a sliding plate 40 as shown in FIG. 3. Each memory piece 42 has a pair of contact portions 42a. One end of a restricting plate 43 is also supported by the pin 41. The restricting plate 43 has a cam projecting portion 43a and a lower stopping projection portion 43b, and a leaf spring 44 is provided between the restriction plate 43 and the sliding plate 40. A push-button 45 is provided at the tip ends of the sliding plate 40 and the restricting plate 43. This push-button 45 is freely slidable in the direction of the arrow D in FIG. 3 by a distance l with respect to the sliding plate 40. In the above state, the memory piece 42 is a freely rotatable state.

Figure 5A:
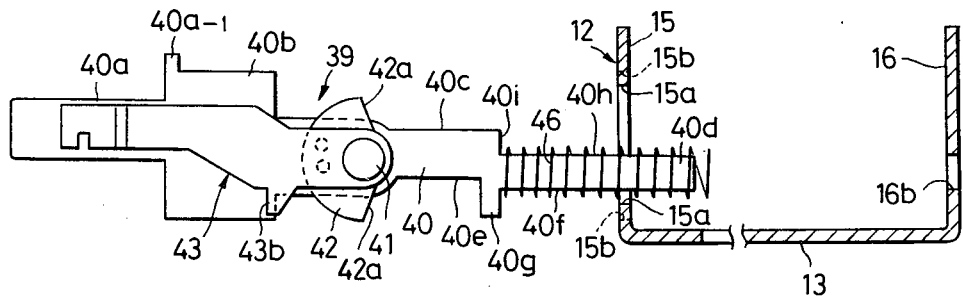
FIGS. 5A, 5B, and 5C are diagrams in vertical cross section respectively showing a series of assembling stages of a push-button assembly of the push-button type tuning apparatus shown in FIG. 1.

As shown in FIGS. 3 and 5A, the sliding plate 43 has, from the front part, a support plate portion 40a, a projecting portion 40a-1, a front plate portion 40b, an intermediate plate portion 40c, and a rear plate portion 40d. Further, depressions 40e and 40f are respectively provided at the lower part of the intermediate plate portion 40c and the rear plate portion 40d. A cam projection 40g is relatively formed between the above depressions 40e and 40f. Moreover, due to a depression 40h provided at the upper part of the rear plate portion 40d, the cam projecting portion 40i is relatively formed at the rear end of the intermediate plate portion 40c. A coil spring 46 is fitted over the rear plate portion 40d.

The sliding plate 40 of the push-button assembly 39 is inserted through the opening 19f of the rotatable member 19, in a state where the sliding plate 40 is inserted through the support holes 15a and 16a of the front and rear side plate parts 15 and 16 with respect to the frame 12. In this state, the upper and lower parts of the front plate portion 40b fit into the upper and lower cutout holes 15b of the support hole 15a. Accordingly, the sliding plate 40 is freely slidable in the directions of the arrows C and D. Normally, the sliding plate 40 is stopped at a position where the sliding plate is urged towards the direction of the arrow C by the coil spring 46, and the stopping projection portion 43b of the restricting plate 43 makes contact with the front side plate part 15. Each cam projection 40g of the push-button assemblies 39-1 through 39-5 is separated from the corresponding cam groove 17a of the clutch lever 17. Moreover, each cam projecting portion 40i enter into the corresponding cam depressions 81a and 81b of the above band changeover plate 81.

Figure 5B:
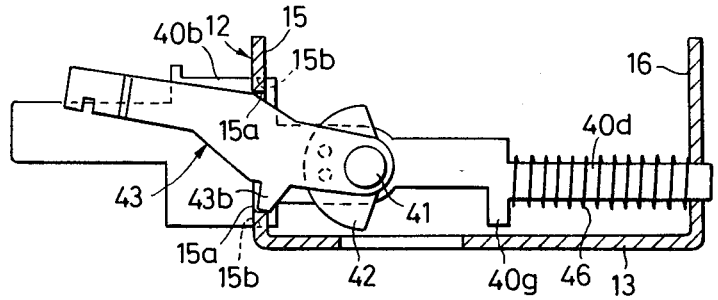
Figure 5C:
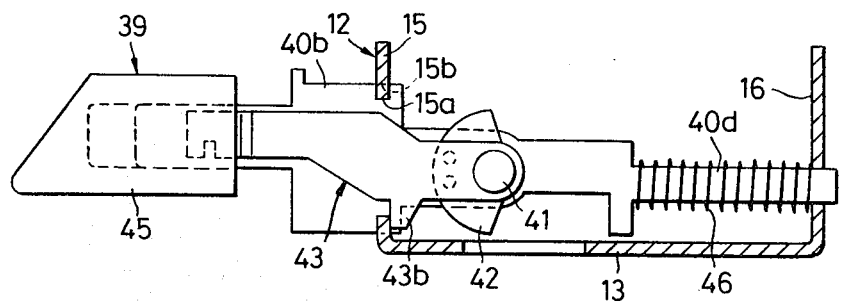
Figure 6:
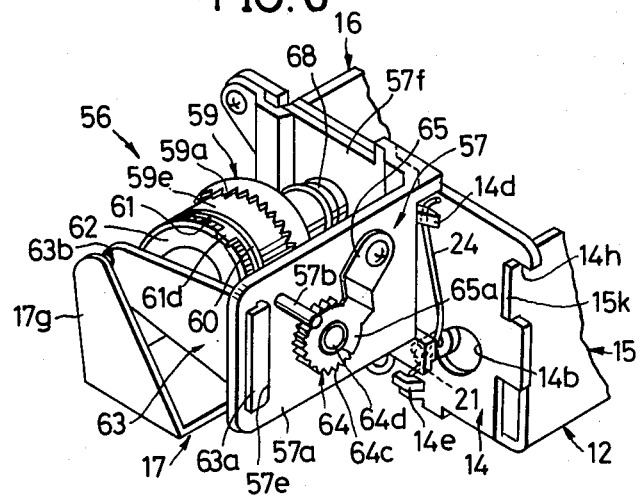
FIG. 6 is a perspective view showing a manual tuning part and a clutch unit part of the push-button type tuning apparatus shown in FIG. 1.

As a procedure for fitting the sliding plate 40 into the support holes 15a and 16a, the cam projection 40g and the upper and lower part of the front plate portion 40b are respectively fitted into the upper and lower cutout holes 15b, by inserting the sliding plate 40 which is not assembled with the push-button 45 into the support holes 15a and 16a of the frame 12 as shown in FIG. 5B. In order for the restricting plate 43 to pass through the support holes 15a, the restricting plate 43 is rotationally displaced upwards as shown in FIG. 5B. The restricting plate 43 is passed through the support hole 15a in a state where the stopping projecting portion 43b is positioned within the vertical height of the support hole 15a. Next, as shown in FIG. 5C, the restricting plate 43 is rotationally returned to the normal position below, and the push button 45 is then assembled to the push-button assembly 39.

The above sliding plate 40 is formed from a metal plate by a blanking operation. However, when inconsistency exists in the thickness of the sliding plate 40 at the end parts thereof, or burr is introduced, play may be introduced upon insertion of the sliding plate 40 into the above support holes 15a and 16a. Therefore, the desired thickness of the plate may be accurately obtained by performing a second blanking operation with respect to the thickness direction of the sliding plate 40, at the part of the front plate portion 40b which is inserted into the upper and lower cutout holes 15b of the support hole 15a, and at the rear plate portion 40d of the sliding plate 40. By inserting the accurately formed sliding plate 40 into the support holes 15a and 16a whose thicknesses are accurately formed, the sliding plate 40 can freely slide without play, and the tuning accuracy of the apparatus can be improved.

By the construction of the above described push-button assemblies 39 and the clutch lever 17, the clutch lever 17 is inserted through the lower depression 40f of the sliding plate 40 in each of the push-button assemblies 39-1 through 39-5, in a perpendicular manner with respect to the sliding plate 40. Hence, clutch lever 17 becomes freely slidable in the directions of the arrows A and B on the upper surface at the rear part of the frame bottom plate portion 13b. Thus, the height and the length along the front to the rear of the tuning apparatus 11 can be reduced, since the above clutch lever 17 does not add an independent measurement with respect to the measurement of the tuning apparatus. Moreover, by the construction of the above push-button assembly 39 and the band changeover plate 81, the band changeover plate 81 is similarly inserted through the upper depression 40h of the sliding plate 40 in each of the push-button assemblies 39-1 through 39-5, in a perpendicular manner with respect to the sliding plate 40. Accordingly, the band changeover plate 81 also does not add an independent measurement with respect to the measurement of the tuning apparatus 11, and the height and the length along the front to the rear of the tuning apparatus 11 can be reduced in a similar manner.

A pointer holder 52 comprises a link plate 53 at the center part thereof, and a guide pin 52b at the lower surface at the rear part thereof. The above link plate 53 consists of a hole 53a and a guide pin 53b and is axially supported by a pin 52a. The pin 52a is fitted with a torsion spring 54. The above guide pin 52b is fitted into the groove 25h of the coil case 25, and the guide pin 53b of the link plate 53 is fitted into the longitudinal hole 37l of the slider 37. Moreover, the hole 53a of the link plate 53 fits over the cylindrical projection 15f of the pointer support plate portion 15e. In addition, a stopping pin 55 made from a synthetic resin is inserted into the hole 15g in a snap manner, in order to prevent the link plate 53 from slipping out. In this state, the pointer holder 52 and the link plate 53 respectively are urged to rotate towards the clockwise and counterclockwise directions by the action of the torsion spring 54. Hence, no play is introduced upon movement of the above pointer holder 52 and the link plate 53. The above pointer holder 52 is further provided with a tip projecting portion 52c, a pair of depressions 52d at the rear part thereof, and an adjusting portion 52e provided between the above depressions 52d for adjusting the position of the pointer holder 52 with respect to a predetermined reference position. When the rotation starting position of the pointer holder 52 is deviated from a correct position due to errors introduced upon assembling of the pointer holder 52, the position of the pointer holder 52 is adjusted by inserting a screw driver and the like into the depression 52d and twisting the screw driver to move the adjusting portion 52e. The accurate rotation starting position can be obtained by aligning the tip projecting portion 52c with one of the projections or depressions of the portion 15j on the right side. Furthermore, a pointer (not shown) made from a separate member is mounted to the front end of the above pointer holder 52.

The manual tuning and clutch unit 56 consists of the L-shaped support plate 57 made of die-cast zinc, the pinion shaft 58, a crown gear 59 made of a synthetic resin, a clutch rubber disc 60, a clutch plate 61 made of a metal leaf spring a conical plate 62 made of a synthetic resin, the rotatable plate 63, an intermediate gear 64 made of a synthetic resin, a metal pushing plate 65, and an Oldham joint half 66, which are assembled in the form of a unit. The above pinion shaft 58 has the pinion 58a which is inserted into and fixed with respect to a pinion shaft portion 58b, and the pinion 58a consists of a fan-shaped stopping projection 58a-1. The clutch plate 61 unitarily comprises an outer peripheral ring-shaped plate portion 61a, an inner peripheral boss plate portion 61b, a resilient connecting portion 61c for connecting the above plate portions 61a and 61b, and four bent projections 61d provided at the outer periphery thereof. The above conical plate 62 consists of a concave tapered depression 62a, four engaging depressions 62b provided at the outer periphery thereof, and a central projection 62c provided at the rear surface thereof. Furthermore, the rotatable plate 63 has a rotatably supporting projection 63a and a projection 63b which is pushed. The pushing plate 65 has a pushing portion 65a and a hole 65b.

As shown in FIGS. 3 through 6, the L-shaped support plate 57 consists of a main plate portion 57a having a pin portion 57b, a hole 57c, a screw hole 57d, and a longitudinal hole 57e. Moreover, a pair of holes 57g and a bearing pipe 67 are unitarily provided on a contacting plate portion 57f. The above bearing pipe 67 consists of a boss portion 67a and a bearing hole 67b. A stopping depression 67a-1 which is cut out for an angular range of 180 degrees along the peripheral direction is formed on the boss portion 67a. In addition, at least the front half of the bearing hole 67b is formed as a triangular hole 67c having a triangular cross section. This triangular cross section has three sides 67c-1, 67c-2, and 67c-3. The rear end of the pinion shaft portion 58b is fitted into a center hole in the inner peripheral boss plate portion 61b of the clutch plate 61, and the pinion shaft portion 58b and the clutch plate 61 accordingly becomes rotatable as one body.

The crown gear shaft 59 is formed with a cut portion 59d cut in the axial direction, at a position along the peripheral direction of a boss portion 59b. This boss portion 59b is provided in front of a crown gear 59a, and has a large-diameter hole 59c. A small-diameter pipe portion 59f having a small-diameter hole 59g is formed at the center of the rear surface of a large-diameter pipe portion 59e. The large-diameter pipe portion 59e is provided at the rear of the crown gear 59a, and has a clutch contacting surface 59e-1. The above crown gear shaft 59 is mounted and supported by fitting the large-diameter hole 59c of the boss portion 59b over a rearwardly projecting portion of the bearing pipe 67 of the support plate 57. Furthermore, due to a C-shaped spring member 68 fitted over the outer periphery of the boss portion 59b, the crown gear 59 is pushed against the outer periphery of the bearing pipe 67 to eliminate play. In addition, the clutch rubber disc 60 is fitted over the small-diameter pipe portion 59f of the clutch gear shaft 59.

In FIG. 3, the above pinion shaft portion 58b which unitarily holds the clutch plate 61, is inserted from the rear end of the small-diameter hole 59g. Hence, the pinion shaft portion 58b is inserted through the triangular hole 67c of the bearing hole 67b in the bearing pipe 67, and projects at the front surface of the boss portion 67a. The above pinion 58a is then inserted with and fixed to the projecting part of the pinion shaft portion 58b. The stopping projection 58a-1 of the pinion 58a thus becomes accommodated within a stopping depression 68a-1. Since the length of the small-diameter pipe portion 59f along the axial direction is larger than the thickness of the clutch rubber disk 60, the ring-shaped plate portion 61a of the clutch plate 61 does not make contact with respect to the clutch rubber disk 60. Moreover, the clutch mechanism 71 is constructed by the clutch contacting surface 59e-1 of the crown gear shaft 59, the clutch rubber disc 60, and the clutch plate 61.

The conical plate 62 is then supported in a state where the engaging depressions 62b and the bent projections 61d engage with each other at the rear surface of the clutch plate 61, and the concave tapered depression 62a and the ring-shaped plate portion 61a oppose each other. In addition, the rotatably supporting projection 63a of the rotatable plate 63 is engaged with the longitudinal hole 57e of the support plate 57. Accordingly, the rotatable plate 63 opposes the projection 62c at the rear surface of the conical plate 62, in a freely rotatable state in the plan view.

The intermediate gear 64 unitarily comprises a pinion 64a, a shaft portion 64b, and a gear portion 64c. This intermediate gear 64 is axially supported at the shaft portion 64b with respect to the hole 57c of the support plate 57, and the pinion 64a meshes with the crown gear 59a. The above pushing plate 65 is fixed to the support plate 57, by screwing a screw 72 through the hole 65b into the screw hole 57d. The pushing plate portion 65a fits over and pushes against a ring-shaped portion 64d shown in FIG. 6 which is provided at the rear surface of the shaft portion 64b of the intermediate gear 64. Accordingly, the intermediate gear 64 is rotatable in a state where the shaft portion 64b is constantly pushing against and making contact with the main plate portion 57a.

The Oldham joint half 66 consists of a disc 66a made from a synthetic resin, and a metal pinion 66c which is fixed to the disc 66a. The above disc 66a has a projecting portion 66b, and the pinion 66c has a hole 66d. The Oldham joint half 66 is axially supported in a state where the hole 66d is fitted over the pin portion 57b of the support plate 57, and the above pinion 66c meshes with the gear portion 64c of the intermediate gear 64.

The above described manual tuning and clutch unit 56 is fixed to the right side plate part 14 shown at the right side in FIG. 3. When the unit 56 is mounted with respect to the plate part 14 of the frame 12, the boss portion 67a of the bearing pipe 67 of the support plate 57 is fitted into the hole 14a of the plate part 14. Moreover, the contacting plate portion 57f is positioned so as to make contact with the plate part 14, and a pair of screws 73 respectively are inserted through the holes 57g into the screw holes 14f. In this state, the pinion 58a of the pinion shaft 58 meshes with the double-gear type fan-shaped gear portions 19b and 22a of the rotatable member 19. Since the above pinion 58a meshes deeply with respect to the fan-shaped gear portions 19b and 22a, the shaft portion 58b is pushed towards a direction opposite to the fan-shaped gear portions 19b and 22a. Hence, play upon rotation is eliminated, because the shaft portion 58b is pushed against the two sides 67c-1 and 67c-2 of the triangular hole 67c in the bearing hole 67b to make contact therewith. The triangular hole 67c of the bearing hole 67b must at least be formed at the front part of the bearing pipe 67 in FIG. 3. However, the above triangular hole 67c may be formed for the entire length of the bearing hole 67b.

Next, the clutch lever 17 is inserted through the lower cutout holes 14g of the right and left side plate parts 14 of the frame 12, and urged towards the direction of the arrow A by the force exerted by the coil spring 18. Thus, the pushing plate portion 17g makes contact with and pushes against the projection 63b of the rotatable plate 63, and rotates the rotatable plate 63 towards the direction of the frame 12 so as to make contact with the projection 62c of the conical plate 62 under pressure. Acordingly, the conical plate 62 slides towards the direction of the arrow A by a slight distance, and the concave tapered depression 62a makes contact with the outer peripheral ring-shaped plate portion 61a of the clutch plate 61. The above plate portion 61a is further displaced towards the direction of the arrow A accompanying resilient deformation of the connecting portion 61c, so that the plate portion 61a is pushed against the clutch contacting surface 59e-1 of the crown gear shaft 59 through the clutch rubber disc 60. Therefore, the clutch mechanism 71 is put to a closed state wherein the clutch contacting surface 59e-1 of the crown gear shaft 59, the clutch rubber disc 60, and the clutch plate 61 mutually push against each other, and the crown gear shaft 59 accordingly becomes unitarily rotatable with respect to the pinion shaft 58. According to the above described clutch mechanism 71, the changeover operation can be performed smoothly and softly without introducing shock, since the changeover operation in which the clutch is opened or closed is performed by sliding the ring-shaped plate portion 61a of the clutch plate 61 along the axial direction accompanying the resilient deformation of the connecting portion 61c, as will be described hereinafter.

In the above manual tuning and clutch unit 56, the intermediate gear 64 and the Oldham joint half 66 are also assembled as one unit, in addition to the pinion shaft 58 and the crown gear shaft 59 provided with respect to the L-shaped support plate 57, by crossing over the axis of rotation in a perpendicular manner. Accordingly, the construction and the assembling operation of the apparatus can be simplified, since the above single unit is mounted to the frame 12.

The above push-button type tuning apparatus 11 is mounted into depression and the like in a dashboard of an automobile, by using the three holes 13c provided in the frame 12. A manual tuning manipulation shaft is mounted to the projecting portion 66b of the Oldham joint half 66 through another joint half.

Generally, the height of the push-button type tuning apparatus is at least limited by the height of the engaging parts, that is, the bent projecting portion 19e and the engaging projections 37h of the slider 37, and the height of the rotatable member 19. However, in the present embodiment of the invention, the following measures are taken. First, the coil case 25 is placed at the depression 16a of the rear side plate part 16. In this state, the upper surface of the coil case 25 is higher than the upper surface of the slider 37, by an amount corresponding to the thicknesses of the pointer support portion 15e and the link plate 53. However, the height of the coil case 25 is only slightly higher and is substantially the same height as the upper ends of the three side plate parts 14 and 15. The guide pole 26 projecting from a central height position of the coil case 25 is fitted into the holes 37e and 37j of the downwardly bending portions 37d and 37i. In addition, the rotatable member 19 is engaged with the downwardly bending portion 37g of the slider 37, and the core 38 is held by the downwardly bending portion 37a. Therefore, the height of the core 38 is restricted at a substantially maximum height position of the entire height of the frame, which is substantially equal to the heights of the above rotatable member 19, the engaging parts of the slider 37, and the guide pole 26.

In both the conventional push-button type tuning apparatus and the push-button type tuning apparatus according to the present invention, the core is held by a downwardly bending plate portion of the slider provided with the core. However, in the conventional apparatus, the engaging parts with respect to the above rotatable member, and the guide pole are arranged and provided at the upwardly bending plate portion. The rotatable member is provided at the lower part of the slider, and the height position of the core becomes relatively low with respect to the entire height of the frame. However, in the apparatus according to the present invention, the core 38 is positioned at the maximum height position, and a relatively high space is formed below the core 38. As shown in FIGS. 1A and 2, the apparatus can be constructed so that the rotatable member 19 is provided below the core 38 which is provided within the cutout depression 37b. This construction could not be realized in the conventional apparatus, since the position of the core became too low when the core is provided within the cutout depression, and interferred with the operation of the rotatable member. Furthermore, since the distance between the contact members 19g of the rotatable member 19 is small, the height of the apparatus can be made substantially equal to or lower than that of the conventional apparatus in which the rotatable member is provided below the slider. In addition, compared to the conventional apparatus in which the rotatable member is provided below the coil case, the height of the apparatus according to the present invention can be reduced substantially, and a thin-type apparatus can be realized.

In order to ensure smooth guidance of the slider 37 by the guide poles 26, the distance between the holes 37e and 37j and the distance between the pair of guide poles must respectively be set to distances approximately equal to those shown in drawings. However, according to the apparatus of the present invention, the pair of projecting plate portions 37c are relatively formed by providing the cutout depressions 37b in the slider 37 which is provided with the cores. Moreover, as described above, the depressions 25e are provided on both sides of the front surface of the coil case 25 which is provided at the same height (level) as the slider 37 provided with the cores. Hence, when the slider 37 slides towards the direction of the arrow D to the maximum limit, the above projecting plate portions 37c are inserted within the depressions 25e in a movable manner. That is, the holes 37j of the projecting plate portions 37c are positioned behind the front surface of the coil case 25. Thus, the sliding distance of the slider 37 can accordingly be increased. Therefore, the coil case 25 can be moved relatively towards the frontward direction in order to obtain a large sliding distance, and the rear end of the coil case 25 can be arranged and provided in a manner so as to substantially coincide with the rear surface of the rear side plate part 16. Further, the length of the tuning apparatus 11 from the front to the rear part thereof can be reduced, enabling reduction of the tuning apparatus as a whole.

The coil case 25 is provided at a position relatively towards the front, so that the rear surface of the coil case 25 substantially coincides with the rear surface of the rear side plate part 16, as described above. Hence, a total projecting length p between the terminal plate 30 which projects rearwardly with respect to the rear side plate part 16 and a part of the coil case 25 shown in FIGS. 1A and 2, is set to a very small value. That is, the total projecting length p is set to a value substantially equal to a rearwardly projecting length Q of the sliding plate 40 from the rear side plate part 16 when the push-button assembly 39 is pushed as will be described hereinafter. Accordingly, the dashboard of the automobile and the like can be used effectively, since the substantial depth, that is, the length of the apparatus from the front to the rear part thereof, which is accommodated within the depression of the dashboard can be reduced significantly.

Next, description will be given with respect to the operation of the above push-button type tuning apparatus 11. First, in order to select and tune in to a desired radio station by rotationally manipulating the manual tuning manipulation shaft upon AM-band tuning, the manipulation shaft is rotated towards the clockwise direction, for example. In this case, the Oldham joint half 66 in FIG. 3 rotates in the direction of the arrow, and the intermediate gear 64 rotates in the direction of the arrow by way of the mesh between the pinion 66c and the gear portion 64c. Furthermore, the pinion shaft 58 as a unit swiftly rotates towards the direction of the arrow through the crown gear shaft 59 and the clutch mechanism 71 which is in a closed state, by way of the mesh between the pinion 64a and the crown gear 59a. Therefore, the rotatable member 19 rotates towards the direction of the arrow through the mesh between the pinion 58a and the fan-shaped gear portions 19b and 22b. Accompanied by this rotation of the rotatable member 19, the slider 37 provided with the core and engaged with the rotatable member 19 slides by a desired distance towards the direction of the arrow C. Accordingly, each core 38 slips out from the AM coils 32 to a desired position, to tune in to the desired AM radio station.

In the pointer mechanism, the link plate 53 rotates towards the direction of the arrow, that is, in the clockwise direction, by the guide provided by the guide pin 53i b and the longitudinal hole 37l. Hence, the pointer holder 52 rotates towards the counterclockwise direction while the guide pin 52b is guided towards the direction of the arrow D by the groove 25h. The above desired radio station is indicated by the pointer provided at the tip end of the pointer holder 52. Since the operation of the pointer holder 52 is similar upon other operations, the description with respect to the pointer holder 52 will be omitted hereinafter. Moreover, when the manual tuning manipulation shaft is rotated to the limit of the rotational range, the stopping projection 58a-1 of the pinion shaft 58 makes contact with both ends of the stopper depression 67a-1 of the support plate 67. Hence, the shock upon stoppage of rotation of the manipulation shaft is insignificant since the pinion shaft 58 hardly acts on the rotatable member 19. Thus, inconsistency is not introduced at the rotatable member 19, and the positioning accuracy with respect to the core 38 can be improved.

Then, an arbitrary push-button assembly 39-1 for the AM band whose memory piece 42 is in a rotationally free state is pushed in the direction of the arrow D. The push-button assembly 39-1 accordingly slides, and the memory piece 42 is rotationally displaced to a desired position where the pair of contact portions 42a respectively make contact with the upper and lower contact members 19g of the rotatable member 19. When the push-button assembly 39-1 is further pushed in, only the push-button 45 slides. The cam projecting portion 43a of the restricting plate 43 relatively enters within the push-button 45, and the restricting plate 43 is rotationally displaced towards the direction of the sliding plate 40, to clamp the memory piece 42 at the above desired rotational position. By releasing the pushing force exerted with respect to the push-button assembly 39, the push-button assembly 39-1 is returned towards the direction of the arrow C in a sliding manner by the action of the coil spring 46. The push-button assembly 39-1 is accordingly returned, and stopped at the position where the stopping projection portion 43b of the restricting plate 43 makes contact with the front side plate part 15.

Next, the manual tuning manipulation shaft is rotationally manipulated in a manner similar to the above case, in order to rotate the rotatable member 19, and select and tune in to another desired radio station in the AM band or the FM band. When the first desired radio station is to be selected again in this state, the above push-button assembly 39-1 is again pushed in. Hence, the push-button assembly 39-1 slides, and the cam projection 40g makes contact with the sloping cam portion 17b of the corresponding cam groove 17a in the clutch lever 17. The above cam projection 40g relatively moves along the sloping cam portion 17b to reach straight portion of the cam groove 17a. Moreover, during the above movement of the cam projection 40g, the clutch plate 17 is slightly moved in a sliding manner towards the direction of the arrow B, against the force exerted by the coil spring 18. Therefore, the pushing action by the conical plate 62 and the rotatable plate 63 with respect to the clutch plate 61 is released, and the connecting portion 61c is resiliently deformed and returned to the original state. The mutual pushing action between the outer peripheral ring-shaped plate portion 61a, clutch rubber disc 60, and the clutch contacting surface 59e-1 is thus released, and the clutch mechanism 71 is put into an open state. Accordingly, the link between the manual tuning shaft and the rotatable member 19 is disengaged, and the rotatable member 19 is put into a state possible to rotate under small load. Then, the upper and lower contact portions 42a of the memory piece 42 respectively make contact with the upper and lower contact members 19g of the rotatable member 19, when the push-button assembly 39-1 is pushed in. Thus, the rotatable member 19 is returned to the above rotational position corresponding to the above desired radio station. Hence, the slider 37 provided with the cores, and the core 38 slide and return similarly to positions corresponding to the above desired radio station.

On the other hand, the upper cam projecting portion 40i of the sliding plate 40 in the push-button assembly 39-1 makes contact with the cam depression 81a for AM band of the band changeover plate 81 shown in FIG. 4B. The cam projecting portion 40i moves along the cam depression 81a and reaches the innermost part thereof, while the band changeover plate 81 is moved in a sliding manner along the direction of the arrow B in FIG. 4B. Accordingly, the knob 82b of the band changeover switch 82 slides from an FM-band selection position shown in FIG. 4B towards the direction of the arrow B, to change over the switch 82 into an AM-band selection state. The above band changeover plate 81 reaches the above AM-band selection position when the push-button assembly 39-1 is pushed first. Hence, in a case where another push-button assembly 39-2 through 39-5 is not manipulated (pushed) or only the push-button assemblies 39-1 through 39-3 for AM band is manipulated in this state, the band changeover plate 81 does not slide and remains at the AM-band selection position. The desired radio station in the AM band which was selected first is thus obtained.

Next, the pushing force exerted against the push-button assembly 39-1 is released. By this releasing operation, the stopping projection portion 43b of the restricting plate 43 slides and returns to the position where the stopping projection portion 43b makes contact with the front side plate part 15. On the other hand, the clutch lever 17 slides and returns towards the direction of the arrow A, to return the clutch mechanism 71 to the closed state. The above clutch mechanism 71 is inevitably put into the open state when the push-button assembly 39-1 is first pushed-in in order to memorize the above desired radio station. This operation in which the clutch mechanism 71 is put into the open state need not be performed during a memorizing operation, however, no inconveniences are introduced since the rotatable member 19 remains in a stable state even when the clutch mechanism 71 is open. Moreover, when the push-button assembly 39-1 is first pushed-in to memorize the above desired radio station, the electrical band selecting function does not have a significant function.

In a case where another desired radio station is to be selected by the above push-button assembly 39-1, the push-button 45 is pulled towards the direction of the arrow C so that the cam projecting portion 43a of the restricting plate 43 becomes exposed outside the push-button 45. Then, the restricting plate 43 rotationally returns in a direction so as to separate from the sliding plate 40, by the action of the leaf spring 44. Hence, the memory piece 42 is again put into the freely rotatable state.

In order to select and tune in to a radio station in the FM band, an operation similar to that described above is performed with respect to the push-button assemblies 39-4 and 39-5.

In addition, the above fan-shaped gear 22 and the clutch unit 56 may respectively be provided at positions other than the right side part of the rotatable member 19 and the right side plate part 14. For example, the fan-shaped gear 22 and the clutch unit 56 may respectively be provided at the left side part of the rotatable member 19 and the left side plate part 14.

Figure 9:
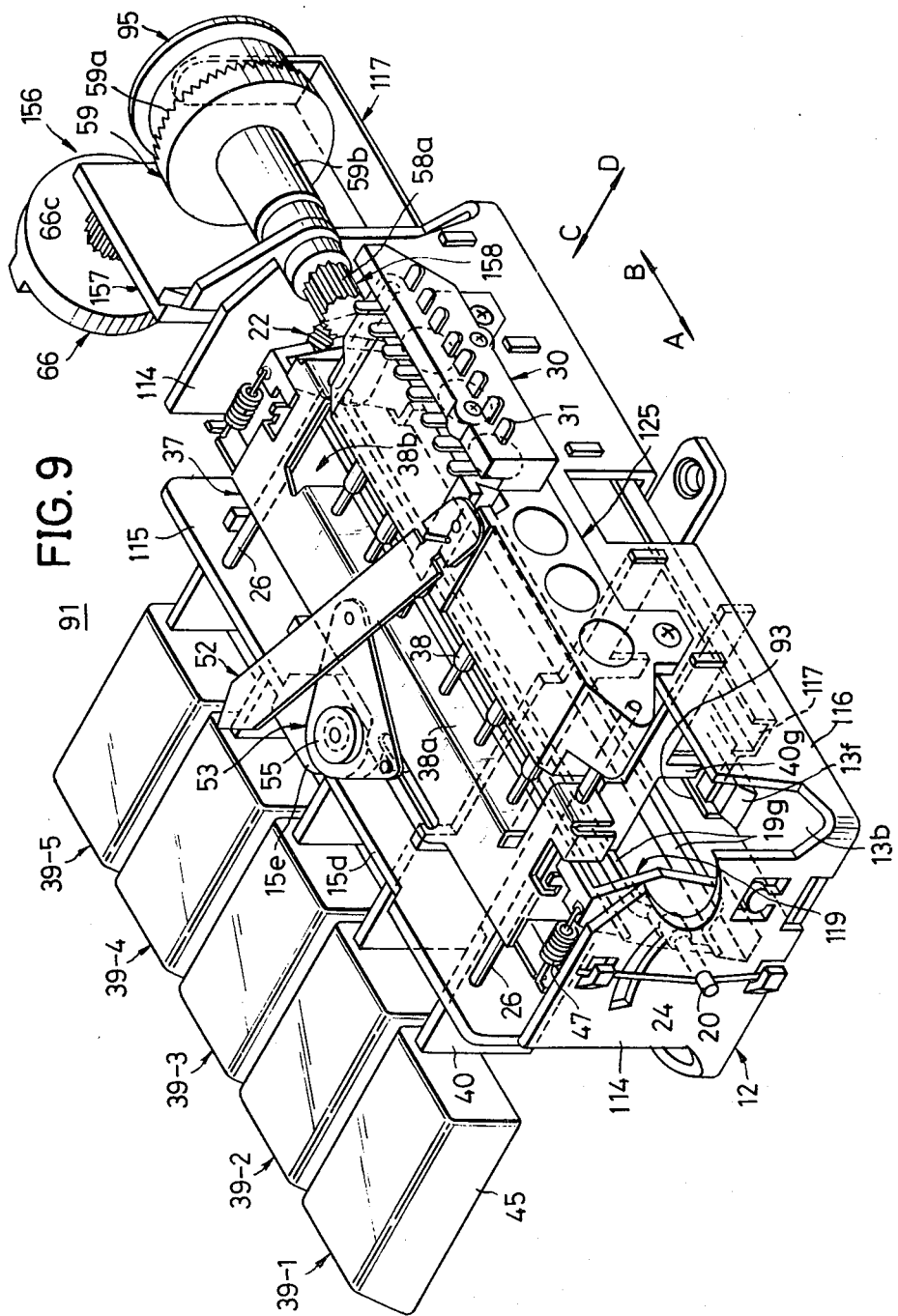

FIGS. 9 and 10 are diagrams respectively showing the whole perspective view and the disassembled perspective view of another embodiment of a push-button type tuning apparatus according to the present invention.

In FIGS. 9 and 10, the terminal plate 30 for AM band, the slider 37 provided with the cores, the push-button assemblies 39-1 through 39-5, the pointer holder 52, the intermediate gear 64, the pushing plate 65, the Oldham joint half 66, and the band changeover plate (not shown) of a push-button type tuning apparatus 91 are the same as those of the push-button type tuning apparatus 11 shown in FIGS. 1 through 3. Accordingly, description with respect to these parts will be omitted.

The push-button type tuning apparatus 91 has a frame 112. This frame 112 is formed from a single metal plate by a drawing process. A bottom plate part 113 consisting of a bottom plate portions 13a and 13b and an opening 13e is unitarily provided with a pair of right and left side plate parts 114, a front side plate part 115, and a rear side plate part 116 having a relatively small height. The bottom plate part 113 is substantially the same as the above described bottom plate part 13, however, in the bottom plate part 113, the bottom plate portion 13b has a projection 13f consisting of a step portion 13g and a pair of screw holes 13h. The right and left side plate parts 114 have symmetrical shapes, and respectively have a U-shaped hole 14j, upper and lower cut-and-raised portions 14k, a stopping hole 14l, a triangular hole 14m, a screw hole 14n, a projecting portion 14p, and a lower rectangular hole 14q. The front side plate part 115 is the same as the front side plate part 15 shown in FIG. 3 except in that, in the front side plate part 115, the mounting plate portions 15h, the portions 15j, and the projecting portions 15l have been eliminated. In addition to enabling the formation of the above pointer support plate portion 15e by bending, the longitudinal holes 15k at the lower part of the front side plate part 115 facilitates the operation in which the above front side plate part 115 is formed from the bottom plate portion 13a by the drawing process. The rear side plate part 116 has a small height, instead of providing the wide depression 16a.

In the above frame 112, the bottom plate part 113, the side plate parts 114 through 116, and the pointer support plate portion 15e are unitarily formed from a single metal plate. Accordingly, the number of parts required can be reduced, and the push-button assemblies 39 can be assembled in the completed state. Hence, the number of stages required for the assembling process can be reduced, and the sliding accuracy of the push-button assemblies 39 can be improved.

A clutch plate 117 is similarly provided with five cam grooves 17a and a lower projection 17d as in the above clutch plate 17. The above clutch plate 117 is further provided with a step portion 17h, a pair of longitudinal holes 17i, and a pushing plate portion 17l provided at the tip end of an extending portion 17j having a hole 17k. Each cam grooves 17a and the lower projection 17d of the clutch plate 117 make contact with the projection 13f and the bottom plate portion 13b at the upper surface of the bottom plate portion 13b, with respect to the frame 112. Hence, the clutch plate 117 is placed in a freely slidable state to slide smoothly in the directions of the arrows A and B, due to the guiding functions of the step portions 13g and 17h and a stopping plate 93 which will be described hereinafter. In the above state, the extending portion 17j passes through the rectangular hole 14q in the right side plate part 114 in FIG. 10, to project outwards. Moreover, the clutch plate 117 is constantly urged towards the direction of the arrow A by the force exerted by the coil spring 18 which is stretched and provided between the hole 17k and the projecting portion 14p. The clutch plate 117 stops at a position where the pushing plate portion 17l makes contact with a conical plate 96 to close a clutch mechanism 171 as will be described hereinafter.

A rotatable member 119 is substantially the same as the rotatable member 19 described above. However, in the rotatable member 119, the support plate portion 19a does not have the fan-shaped gear and the like, but instead, is provided with a hole 19h, a side end surface 19i, and a hole 19j formed in the bent projecting portion 19e.

A gear 92 which is made from a synthetic resin comprises a helical fan-shaped gear portion 92b provided in the form of a visor, pin portions 92c and 92d, and a hole 92e. The width of the teeth in the above helical gear portion 92b is larger than the thickness of a main plate portion 92a. The above hole 92e fits over the pin 21 with respect to the rotatable member 119. The gear 92 is fixed in a state where the pin portion 92c is inserted into the hole 19h and the peripheral parts of the hole 19h are appropriately secured. In the above state, the part of the fan-shaped gear portion 92b projecting in the form of a visor along the width direction of the teeth, substantially makes contact with and is supported by the side end surface 19i of the support plate portion 19a at the back surface thereof. Hence, the projecting part of the fan-shaped gear portion 92b is not bent when the gear portion 92b meshes with the pinion 58a which will be described hereinafter, and no play is introduced with respect to the above mesh. Actually, a pinion shaft 158 bends. Furthermore, the above projecting part of the fan-shaped gear portion 92b overlaps with the thickness of the support plate portion 19a. Therefore, the lengths of the rotatable member 119 and the fan-shaped gear 92 along the longitudinal direction can accordingly be reduced.

The reason why the above fan-shaped gear 92 is a helical type gear, is to obtain a mesh between the gear 92 and the spur gear pinion 58a of the above pinion shaft 158 which is made of a synthetic resin, whereby the backlash is eliminated due to the resiliency of the synthetic resin material. Therefore, the construction can be simplified compared to the conventional type which used a combination of two fan-shaped gears in order to eliminate the backlash. In addition, the width of the teeth in the fan-shaped gear portion 92b can be made large, although the length along the longitudinal direction is small as described above. Accordingly, the slope of the helical teeth with respect to the axial direction can be reduced, to improve the state of the mesh with respect to the pinion 58a. Thus, a positive and smooth mesh can be obtained.

The above rotatable member 119 unitarily holding the fan-shaped gear 92 is supported with respect to the frame 112 in a state where the pins 20 and 21 respectively are inserted through the triangular holes 14m in the side plate parts 114. Moreover, the above pins 20 and 21 are pushed by the action of the wire spring 24 provided between the upper and lower cut-and-raised portions 14k towards the direction of the arrow D in FIG. 10, to make contact with the two sides of the triangular holes 14m. Hence, the rotatable member 119 is axially supported in a freely rotatable state without play. Similarly as in the apparatus shown in FIG. 3, the rotatable member 119 is also eliminated of the play in the axial direction, since the wire spring 24 engages with the outer peripheral groove portion of the pin 21. Furthermore, the pin portion 92d of the fan-shaped gear 92 is inserted into the stopping hole 14l of the side plate part 114 in a movable manner. Thus, when the rotatable member 119 is rotated, the pin portion 92d makes contact with both ends of the stopping hole 14l to restrict the rotational range of the rotatable member 119.

A coil case 125 has a construction similar to that of the coil case 25 shown in FIG. 3. The coil case 125 is not made of zinc, but made of aluminum in the form of a rectangular parallelopiped through a die-cast process. The coil case 125 has six holes 25j respectively provided with a step and having a circular cross section. The pair of guide poles 26 are fitted into and fixed to the coil case 125, and the core sleeves 28 are inserted into the corresponding three holes 25j on the right side in FIG. 10. The coils 32 of the terminal plate 30 for AM band are inserted into the above core sleeves 28. In addition, similarly as in the apparatus shown in FIG. 3, the terminal plate for FM band (not shown) is fixed to the coil case 125.

The above coil case 125 is fixed to the frame 112 by screws, in a state where the lower surface of the coil case 125 makes contact with the upper end of the rear side plate part 116 and each projecting plate portion 25f makes contact with the rear surface of the rear side plate part 116. In this state, the guide poles 26 are positioned by inserting the guide poles 26 through the holes 15c of the front side plate part 115.

The core holding slider 37 is identical to that shown in FIG. 3. The slider 37 can be linked to the rotatable member 119, and is free to slide in the directions of the arrows C and D, in a state guided by the guide poles 26. The coil springs 47 are respectively stretched and provided between the projecting portions 37f of the slider 37 and the holes 19j of the rotatable member 119, in order to eliminate play between the rotatable member 119 and the slider 37. Moreover, each of the cores 38 are in states free to enter into and leave from the corresponding hole 25j in the coil case 125.

The push-button assemblies 39-1 through 39-5 are supported in a state freely slidable in the directions of the arows C and D with respect to the frame 112. However, the push-button assemblies 39-1 through 39-5 are normally urged towards the direction of the arrow C by the forces exerted by the coil springs 46. Each of the above push-button assemblies 39 are stopped at positions where the respective cam projection 40g makes contact with the stopping plate 93.

The stopping plate 93 has an L-shaped cross section, and has a pair of holes 93b in a contact plate portion 93a, and three pushing plate portions 93d in a stopping plate portion 93c. This stopping plate 93 is fixed to the frame 112 in a state where the contact plate portion 93a makes contact with the lower surface of the projection 13f, by screwing screws 94 through the holes 93b into screw holes 13h. The pushing plate portions 93d makes contact with the upper surface of the clutch plate 117, to prevent the clutch plate 117 from rising upwards. The above push-button assemblies 39 which are urged towards the direction of the arrow C, respectively are stopped by stopping the cam projections 40g by the stopping plate portion 93c.

In addition to the function to stop the sliding of the push-button assemblies 39 towards the direction of the arrow C, the above cam projections 40g also function to drive and slide the clutch plate 117 as will be described hereinafter. Moreover, the cam projections 40g are relatively formed simultaneously as when the depressions 40f are formed in the sliding plate 40 for passing through the above clutch plate 117 in a perpendicular manner, and the construction of the apparatus can accordingly be simplified.

The construction of the pointer holder 52 and the manner in which the pointer holder 52 is mounted to the frame 112 is identical to that for the apparatus shown in FIG. 3.

A manual tuning and clutch unit 156 consists of an L-shaped support plate 157 made of brass, the pinion shaft 158 made of a synthetic resin having a pinion 58a, a shaft portion 58b, and a screw hole 58d provided with a portion 58c formed by spot facing, a crown gear shaft 159 made of a synthetic resin, a bowl-shaped clutch plate 95 having made of metal, the metal conical plate 96, the intermediate gear 66 made of a synthetic resin, the metal pushing plate 65, and the Oldham joint half 66, which are assembled in the form of a unit. The L-shaped support plate 157 is substantially identical to the support plate 57 shown in FIG. 3, except in that a hole 57i and a bearing pipe 167 are unitarily provided with respect to a contact plate portion 57h. The bearing pipe 167 is of a construction similar to that of the bearing pipe 67 shown in FIG. 3 having the boss portion 67a and the bearing hole 67b. However, in the bearing pipe 167 shown in FIG. 10, substantially the front half and the rear half of the bearing hole 67b in FIG. 10 respectively are shaped as a hole 67c having a triangular cross section and a hole 67d having a circular cross section. The triangular cross section of the hole 67c have three sides 67c-1, 67c-2, and 67c-3. Thus, the pinion shaft 158 is supported in a state where the shaft portion 58b is inserted into the bearing hole 67b of the bearing pipe 167.

The clutch gear shaft 159 has a construction similar to the clutch gear shaft 59 shown in FIG. 3. The crown gear shaft 159 is formed with a pair of cut portions 59h cut in the axial direction, at positions along the peripheral direction of the boss portion 59b. The boss portion 59b has the large-diameter hole 59c, and is provided in front of the crown gear 59a. A resilient arm portion 59i having a projection 59j at the inner peripheral tip end thereof, is formed between the above pair of cut portions 59h. Moreover, a tapered portion 59k and a small-diameter pipe portion 59l are respectively provided at the end surface and the center of the large-diameter pipe portion 59e positioned behind the crown gear 59a. The above small-diameter pipe portion 59l has a small-diameter hole 59g.

The crown gear shaft 159 is supported in a state where the rearwardly projecting portion of the bearing pipe 167 is inserted into the large-diameter hole 59c of the boss portion 59b, and the projecting portion of the shaft portion 58b of the pinion shaft 158 is inserted into the small-diameter hole 59g. When the pinion 58a of the pinion shaft 158 makes contact with the front end surface of the bearing pipe 167, the rear end surface of the shaft portion 58b coincides with or projects slightly with respect to the end surface of the small-diameter pipe portion 59l. On the other hand, the projection 59j of the resilient arm portion 59i at the boss portion 59b of the crown gear shaft 159 rides over to the outer periphery of the bearing pipe 167, and is resiliently deformed outwards. Accordingly, due to the resilient force exerted by the resilient arm portion 59i, the boss portion 59b becomes in close contact with the bearing pipe 167. Therefore, the crown gear shaft 159 can be rotated with respect to the bearing pipe 167 without play, in an accurate manner.

The clutch plate 95 is of a bowl shape, and has a convex tapered portion 95b at the outer periphery of a depression 95a, and further provided with a pipe portion 95d at the center of a resilient rib plate portion 95c. The pipe portion 95d of the clutch plate 95 is inserted into the portion 58c at the rear end of the pinion shaft 158, within the large-diameter pipe portion 59c of the crown gear shaft 159. Further, a screw 97 is screwed into the screw hole 58d in the pinion shaft 158 through the pipe portion 95d, to fix the clutch plate 95. The above resilient rib plate portion 95c is not resiliently deformed in the above state. Accordingly, the convex tapered portion 95d and the tapered portion 95a constructing the clutch mechanism 171 are mutually separated by a small distance along the axial direction, and the clutch mechanism 171 is accordingly in an open state. The conical plate 96 having a vertex portion 96a is accommodated within the tapered portion 95a of the clutch plate 95.

The intermediate gear 64 and the Oldham joint half 66 is mounted to the support plate 157 as in the apparatus shown in FIG. 3.

The completed manual tuning and clutch unit 156 is fixed to the frame 112 in a state where the boss portion 67a of the bearing pipe 167 of the support plate 157 is fitted into the U-shaped hole 14j and positioning the contact plate portion 57h so as to make contact with the side plate part 14, by screwing the screws 73 through the holes 57i into the screw holes 14n with respect to the side plate part 14 at the right side of FIG. 10. In the above state, the pinion 58a of the pinion shaft 158 meshes with the fan-shaped gear portion 92b of the fan-shaped gear 92. Moreover, the clutch plate 117 is pulled back towards the direction of the arrow B against the force exerted by the spring 18. Therefore, the pushing plate portion 17l of the clutch plate 17 is urged to make contact with the vertex portion 96a of the conical plate 96. Thus, the resilient rib plate portion 95c of the clutch plate 95 is pushed by the above conical plate 96 at the parts in the vicinity of the tapered portion 95a. Hence, the whole resilient rib plate portion 95c undergoes resilient deformation in an arcuate manner. The convex tapered portion 95b is accordingly displaced towards the direction of the arrow A to push against a concave tapered portion 59k of the clutch gear shaft 159, and the clutch mechanism 171 is then put into a closed state. Further, at the position where the above clutch mechanism 171 becomes closed, the sloping cam portion 17b of each cam groove 17a in the clutch plate 17 is close to but separated from the cam projections 40g of the push-button assemblies 39-1 through 39-5.

The pinion shaft 158 meshes deeply with respect to the pinion 58a, to form a positive mesh. Hence, the part of the shaft portion 58b which fits into the circular hole 67d of the bearing hole 67b is held is a positive manner. Moreover, the part of the shaft portion 58b which fits into the triangular hole 67c is bent in a direction opposite with respect to the fan-shaped gear portion 92b. Thus, the above part of the shaft portion 58b makes contact with the two sides 67c-1 and 56c-2 of the triangular hole 56c, and the play upon rotation is positively eliminated. Furthermore, due to the bend introduced in the above shaft portion 58b, the pinion 58a is pushed against and meshes with the fan-shaped gear portion 92b. Therefore, significant effect is obtained in eliminating backlash in the mesh between the above spur gear and the helical teeth. The above triangular hole 67c of the bearing hole 67b need only be formed at the front part of the bearing shaft 167 in FIG. 10. However, the triangular hole may be provided for the entire length of the bearing hole 67b.

As described above, the height of the rear side plate part 116 is set low instead of providing the wide depression 16a in the rear side plate part 16 as in the apparatus shown in FIG. 3. Accordingly, in the push-button type tuning apparatus 91 according to the present invention, the height of the apparatus can be reduced in a similar manner, since the height of the rear side plate part 16 itself is low.

Next, description will be given with respect to the above tuning apparatus 91. Similarly as in the tuning apparatus 11 shown in FIG. 3, in FIGS. 9 and 10, the manual tuning shaft of the tuning apparatus 91 is rotated towards the clockwise direction, for example, in order to select and tune in to a radio station in the AM band. By the rotation of the manual tuning shaft, the rotational movement is transmitted to the pinion shaft 158 through the Oldham joint half 66, the intermediate gear 64, the crown gear shaft 159, and the clutch mechanism 171 which is in the closed state, to quickly rotate the pinion shaft 158. Accordingly, the fan-shaped gear 92 and the rotatable member 119 which is provided unitarily with the fan-shaped gear 92, rotate in the direction of the arrow in FIG. 10. Moreover, the slider 37 which is engaged with the fan-shaped gear 92 slides by a desired distance in the direction of the arrow C. The tuning apparatus 91 is thus tuned in to the desired radio station in the AM band, by the operation of the cores 38 and the coils 32 for AM band.

Then, an arbitrary push-button assembly 39-1 is pushed in towards the direction of the arrow D. The memory piece 42 of the push-button assembly 39-1 makes contact with the rotatable member 119 and rotates, and the push-button assembly 39-1 is further pushed in, in this state. By performing these operations, only the push-button 45 slides, and the above memory piece 42 is clamped at the desired rotational position by the restricting plate 43. When the pushing force exerted with respect to the above push-button assembly 39-1 is released, the push-button assembly 39-1 slides and returns towards the direction of the arrow C, by the action of the coil spring 46. The above push-button assembly 39-1 stops at a position where the cam projection 40g makes contact with the stopping plate 93.

When the operator wants to tune in to the above desired radio station in the AM band which was first memorized, the push-button assembly 39-1 is again pushed in. This time, the cam projection 40g makes contact with the clutch plate 117, and slides the clutch plate 117 in the direction of the arrow B against the force exerted by the coil spring 18. Accordingly, the pushing action by the conical plate 96 with respect to the clutch plate 95 is released, and the resilient rib plate portion 95c undergoes resilient deformation to return to the original plate shape. Hence, the convex tapered portion 95b separates from the concave tapered portion 59k, to put the clutch mechanism 171 into an open state. Therefore, the link between the manual tuning shaft and the rotatable member 119 becomes disengaged, and the rotatable member 119 is put into a state capable of rotating under small load. Thus, the rotatable member 119 is returned to the rotational position corresponding to the above desired radio station, when the push-button assembly 39-1 is pushed in. The above desired radio station which has been memorized can thus be obtained, through the operation of the slider 37 and the cores 38.

On the other hand, when the pushing force against the push-button assembly 39-1 is released, the push-button assembly 39-1 returns in a sliding manner to a position where the push-button assembly 39-1 is stopped by the stopping plate 93. Moreover, the clutch plate 117 slides and returns towards the direction of the arrow A while the above push-button assembly 39-1 is sliding. Therefore, the pushing plate portion 17l of the clutch plate 117 pushed against the clutch plate 95 through the conical plate 96. The clutch mechanism 171 is thus put into a closed state.

In the above described embodiment of the present invention, the resilient arm portion 59i of the crown gear shaft 159 is moulded unitarily thereto. However, a resilient arm made of metal or a synthetic resin may be fixed to the cut portion of the boss portion 59b in the crown gear shaft 159.

Moreover, the above fan-shaped gear 92 and the manual tuning and clutch unit 156 are respectively provided at the right side part of the rotatable member 119 and the right side plate part 114. However, the gear 92 and the unit 156 may be provided at the left side part of the rotatable member 119 and the left side plate part 114.

Further, the present invention is not limited to these embodiments, but various variations and modifications may be made without departing from the scope of the present invention.

What is claimed is:

1. A push-button type tuning apparatus comprising:
a frame comprising a front side plate part having a plurality of first support holes, a rear side plate part having a plurality of second support holes, right and left side plate parts, and bottom plate part, said frame being formed from a single plate member by unitarily bending the front and rear side plate parts and the right and left side plate parts at four sides of the bottom plate part, each of said first support holes having a pair of cutout holes formed above and below the first support hole at mutually opposing positions so as to communicate to said first support hole;
a plurality of push-button assemblies each having a sliding plate, a memory piece which is rotatably provided on said sliding plate, a restricting plate for restricting said memory piece, said restricting plate being rotatably provided on said sliding plate, and a push-button which is fixed to a front end of said sliding plate, each of said push-button assemblies being supported freely slidable in frontward and backward directions in a state where the push-button assembly is inserted through corresponding support holes in said front and rear side plate parts and urged frontward by spring means; and
a control mechanism supported between said right and left side plate parts in a state free to link with the memory piece in each of said push-button assemblies, for operating a tuning mechanism,
each of said restricting plates comprising a stoping projection portion which makes contact with said front side plate part to stop each of said push-button assemblies from sliding in the frontward direction,
each of said restricting plates which are only assembled with said memory piece and said sliding plate, being inserted through a corresponding first support hole in a state where the restricting plate is rotationally displaced so that said stopping projection portion corresponds within a height dimension of the first support hole before the sliding plate is fitted into said pair of cutout holes of said first support hole,
each of said push-buttons being fixed to the front end of a corresponding sliding plate in a state where said restricting plates are rotationally restored to regular positions so that said stopping projection portions assume corresponding positions where said stopping projection portions can make contact with said front side plate part.

2. An apparatus as claimed in claim 1 in which both said right and left side plate parts of the frame are respectively arranged with respect to the front and rear side plate parts so that both side end portions of the respective side plate parts are adjacent another, a projecting portion projecting outward is provided on both side end portions of one of the adjacent side plate parts, a hole into which a corresponding projecting portion is inserted is provided on both side and portions of the other of the adjacent side plate parts, and the adjacent side plate parts are fixed to each other by deforming at least one of the projecting portions and the holes.

3. An apparatus as claimed in claim 1 in which said front side plate part has a pointer support plate portion which is bent and formed unitarily at substantially the center position at the upper end thereof with respect to the right and left sides, and said pointer support plate portion extends towards the rear side plate part in a substantially parallel manner with respect to the bottom plate part and is mounted with a part of a pointer mechanism.

4. An apparatus as claimed in claim 3 in which one or a plurality of holes through which an instrument is inserted in order to bend and form the pointer support plate portion, are provided in the vicinity of the front side plate part of the bottom plate part at positions corresponding to the pointer support plate portion.

5. An apparatus as claimed in claim 3 in which a depression is provided in advance of the part in the upper end of the front side plate part where the pointer support plate portion is provided, and heights of the upper surface of the pointer support plate portion and the upper end of both the right and left side plate parts are substantially the same due to said depression.

6. An apparatus as claimed in claim 1 which further comprises a coil case which is fixedly provided on the frame for supporting coils in said tuning mechanism, the rear side plate part having fixing means for fixing the coil case which is placed onto the uppr end of the rear side plate part, the height position of the upper end of the rear side plate part being lower than the upper end of both the right and left side plate parts, and the height position at the upper surface of the coil case being substantially the same height as the upper end of both the right and left side plate parts.

7. An apparatus as claimed in claim 1 in which said control mechanism comprises a rotatable member which is rotatably supported at both said right and left side plate parts, the bottom plate part has an opening provided at a position corresponding to the rotatable member, and said opening permits a part of said rotatable member to enter therein upon rotation of the rotatable member.

8. An apparatus as claimed in claim 5 which further comprises a plurality of guiding members having at least one end fixed to the front side plate part and extending towards the rear side plate part, said control mechanism comprising a slider which is capable of sliding under the guidance of said guiding members, said slider having a projecting plate portion which has a hole, and the depression in the front side plate part permits the projecting plate portion of the slider which is linked with the part of the pointer mechanism to enter therein when said slider slides in the frontward direction.

9. An apparatus as claimed in claim 1 which further comprises a coil case which is fixedly provided on the frame for supporting coils in said tuning mechanism, the cross-sectional shapes of holes for accommodating coils in the coil case being substantially rectangular within a range excluding such parts as screw holes for mounting a terminal base plate used for dealing with coil terminals and within a range in which the holes for accommodating the coils do not communicate with each other.

10. An apparatus as claimed in claim 1 in which said control mechanism comprises a rotatable member which is rotatably supported at both said right and left side plate parts, said apparatus further comprises manual tuning means for driving the rotatable member in a geared manner, said rotatable member is unitarily formed with support plate portions at both ends along the longitudinal direction thereof by bending a single plate, said support plate portions supporting gears which mesh with a gear of the manual tuning means, said rotatable member is also unitarily formed with contact members in the longitudinal direction at both ends along the width direction thereof, and said contact members make contact with the memory pieces.

11. An apparatus as claimed in claim 1 in which said control mechanism comprises a rotatable member which is rotatably supported at both said right and left side plate parts, and said apparatus further comprises manual tuning and clutch means provided on the frame, said manual tuning and clutch means consisting of:

a first rotary body rotated by gearing with the rotation of a predetermined manual tuning shaft;

a second rotary body fitted into said first rotary body, capable of rotating separately with respect to said first rotary body with a common axis, for rotationally driving the rotatable member in a geared manner; and clutch means provided between said first and second rotary bodies, for normally putting both the first and second rotary bodies in a unitarily rotatable state when the clutch means is in a closed state and putting the first and second rotary bodies in a separately rotatable state when the push-button assemblies are pushed in, said clutch means unitarily consisting of an end surface of said first rotary body, an outer peripheral ring-shaped plate portion, an inner peripheral plate portion, and a resilient connecting portion connecting the outer and inner peripheral plate portions in a substantially radial manner, and being arranged and provided opposing the end surface of said first rotary body with a common axis, said clutch means having a pushing plate consisting of an intermediate clutch plate whose inner peripheral plate portion is fixed to said second rotary body with a common axis in an unitarily rotatable manner, and a concave tapered portion provided in the vicinity of the outer periphery thereof, said pushing plate being arranged and provided with a common axis opposing the outer peripheral ring-shaped plate portion of said intermediate clutch plate, said pushing plate gearing with the push-button assembly returning in a sliding manner and sliding towards said intermediate clutch plate, so that said concave tapered portion makes contact with said ring-shaped plate portion to displace the ring-shaped plate portion in the axial direction accompanying resilient deformation of said connecting portion, and the end surface of said first rotary body is pushed directly or indirectly by said pushing plate, to put said first and second rotary bodies in the clutch closed state capable of rotating unitarily through said intermediate clutch plate.

12. A push-button type tuning apparatus as claimed in claim 1 which further comprises:

a coil case fixed to the rear side plate part of the frame, a plurality of coils being arranged and provided within said coil case;

a plurality of guiding members extending substantially in parallel with respect to the bottom plate part between said front and rear side plate parts, one end of each of the guiding member being fixed to the front side plate part of the frame while the other end is fixed to the coil case;

a slider unit mounted with a plurality of tuning cores which are displaced within the coils, said slider unit being arranged and provided in a sliding manner on the guiding members;

a rotatable member engaged so as to gear with the slider unit, said rotatable member being axially supported in a rotatable state at both the right and left side plate parts of the frame;

manual tuning selection means arranged and provided on the frame in a state possible to gear with the rotatable member; and a clutch unit provided between the rotatable member and the manual tuning selection means, for interrupting the gearing between the rotatable member and the manual tuning selection means upon manipulation of said push-button assembly, said clutch unit including a clutch lever for detecting displacement upon manipulation of said push-button assembly, said slider unit and said rotatable member being parts of said control mechanism.

13. An apparatus as claimed in claim 1 in which both said right and left side plate parts of the frame are respectively arranged with respect to the front and rear side plate parts so that both side end portions of the respective side plate parts are adjacent another, a projecting portion projecting outward is provided on both side end portions of one of the adjacent side plate parts, a cutout depression into which a corresponding projecting portion is inserted is provided on both side end portions of the other of the adjacent side plate parts, and the adjacent side plate parts are fixed to each other by deforming at least one of the projecting portions and the cutout depressions.

* * * * *